(12) United States Patent
Ordentlich et al.

(10) Patent No.: US 8,407,560 B2
(45) Date of Patent: Mar. 26, 2013

(54) SYSTEMS AND METHODS FOR ENCODING INFORMATION FOR STORAGE IN AN ELECTRONIC MEMORY AND FOR DECODING ENCODED INFORMATION RETRIEVED FROM AN ELECTRONIC MEMORY

(75) Inventors: Erik Ordentlich, San Jose, CA (US); Ron M. Roth, Haifa (IL); Pascal Vontobel, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 362 days.

(21) Appl. No.: 12/836,405

(22) Filed: Jul. 14, 2010

(65) Prior Publication Data

US 2012/0017136 A1     Jan. 19, 2012

(51) Int. Cl.
*G11C 29/00*  (2006.01)
*H03M 13/00*  (2006.01)
*G06F 11/00*  (2006.01)

(52) U.S. Cl. ........ 714/763; 714/764; 714/767; 714/777; 714/800

(58) Field of Classification Search .................. None
See application file for complete search history.

(56) References Cited

U.S. PATENT DOCUMENTS

| 6,170,076 | B1 | 1/2001 | Kim |
| 6,456,208 | B1 * | 9/2002 | Nazari et al. .................... 341/59 |
| 6,460,159 | B1 | 10/2002 | Kim et al. |
| 6,768,778 | B1 | 7/2004 | Chen et al. |
| 7,170,946 | B2 | 1/2007 | Huang et al. |
| 2007/0053378 | A1 * | 3/2007 | Kuekes et al. ................ 370/464 |
| 2010/0281340 | A1 * | 11/2010 | Franceschini et al. ........ 714/763 |
| 2012/0198306 | A1 * | 8/2012 | Myung et al. .................. 714/758 |

OTHER PUBLICATIONS

Poulin, David et al., "Quantum serial turbo-codes", California institute of Technology CA, Jun. 10, 2009.

* cited by examiner

*Primary Examiner* — Guerrier Merant

(57) ABSTRACT

Method and system embodiments of the present invention are directed to encoding information in ways that are compatible with constraints associated with electrical-resistance-based memories and useful in other, similarly constrained applications, and to decoding the encoded information. One embodiment of the present invention encodes k information bits and writes the encoded k information bits to an electronic memory, the method comprising systematically encoding the k information bits to produce a vector codeword, with additional parity bits so that the codeword is resilient to bit-transition errors that may occur during storage of the codeword in, and retrieval of the codeword from, the electronic memory, ensuring that the codeword does not violate a weight constraint, and writing the codeword to the electronic memory.

20 Claims, 19 Drawing Sheets

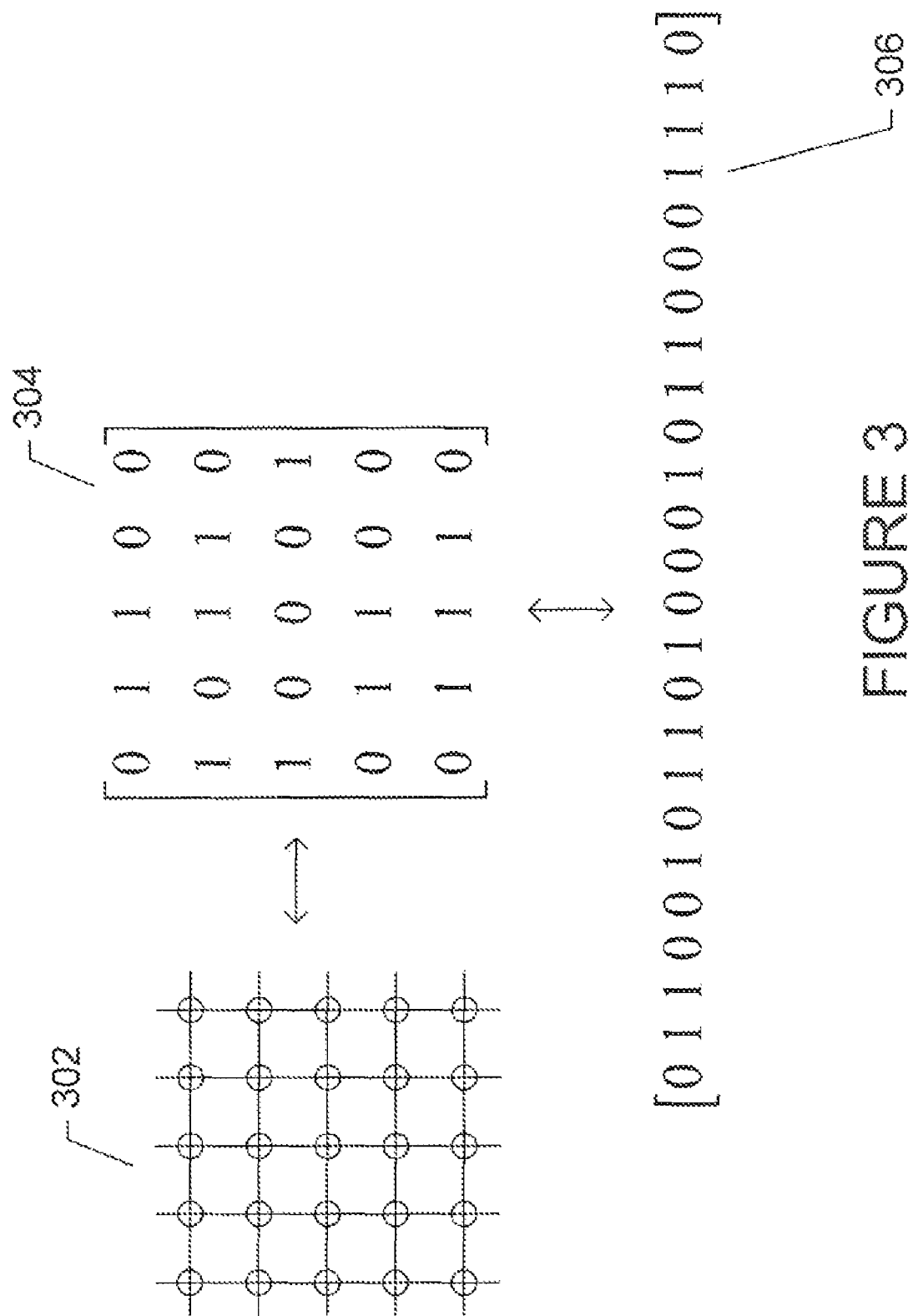

SYSTEMS AND METHODS FOR ENCODING INFORMATION FOR STORAGE IN AN ELECTRONIC MEMORY AND FOR DECODING ENCODED INFORMATION RETRIEVED FROM AN ELECTRONIC MEMORY

STATEMENT OF GOVERNMENT INTEREST

This invention has been made with Government support. The government has certain rights in the invention.

TECHNICAL FIELD

The present invention is related to error-control coding and electronic memories and, in particular, to methods and systems for encoding information for storage in electronic memories associated with constraints related to the encoded information.

BACKGROUND

Error-control coding is a well-developed, interdisciplinary field that spans applied mathematics, computer science, and information theory. Error-control coding techniques are used throughout modern computing, communications, and data-storage systems. In general, error-control coding involves supplementing digitally encoded information with additional, redundant information in order to render the encoded information less susceptible to corruption or loss due to various types of transmission errors, errors that arise as the encoded information is passed through various types of physical and logical interfaces, and errors that arise when the information is stored in, and retrieved from, various types of electronic data-storage media.

Recently, a new generation of electrical-resistance-based memories, various types of which include one-dimensional, two-dimensional, and three-dimensional arrays of nanoscale resistors or memristors, have been developed for a variety of data-storage and computational applications. These newly developed memory arrays have various electronic and physical properties and characteristics that constrain the types of data that can be stored within, and retrieved from, the memories. Researchers and developers of these new types of memories therefore are seeking error-control-coding techniques that can accommodate the data constraints associated with electrical-resistance-based memories, and error-control-coding theoreticians and researchers continuously seek new methods and systems for error-control coding applicable to newly encountered and not-yet encountered applications.

BRIEF DESCRIPTION OF THE DRAWINGS

FIG. 3 illustrates conventions used in subsequent discussion of embodiments of the present invention.

DETAILED DESCRIPTION OF THE INVENTION

Method and system embodiments of the present invention are directed to encoding information in ways that are compatible with constraints associated with electrical-resistance-based memories and useful in other, similarly constrained applications, and to decoding the encoded information. Method and system embodiments of the present invention employ a combination of error-control coding techniques and encoding and decoding techniques based on bitwise complementation operations. The error-control-coding techniques provide systematic redundancy, error detection, and error correction, and the bitwise-complement operations generate encoded information that satisfies the constraints associated with electrical-resistance-based memories and other application domains.

It should be noted, at the onset, the method embodiments of the present invention, discussed below, are necessarily implemented for execution on a computer system and/or implemented as logic circuits within an electronic device. When executed by a general-purpose computer, the general-purpose computer is transformed into a special-purpose encoding and decoding machine that represents a system embodiment of the present invention. The methods of the present invention cannot be carried out by hand calculation or by mental calculation, because the methods involve very large numbers of arithmetic and logic operations, even when small amounts of information are encoded. Calculation by any means other than an electronic computer or other electronic device would take many orders of magnitude of time in excess of the times needed for preparing data for storage in electronic memories, and would be far too error prone to serve any practical purpose.

In a first subsection, below, electrical-resistance-based memories are described, along with a data constraint associated with certain electrical-resistance-based memories. In a second subsection, certain error-control-coding techniques are described. In a third subsection, certain embodiments of the present invention are discussed.

Electrical-Resistance-Based Memories

Figure 1:
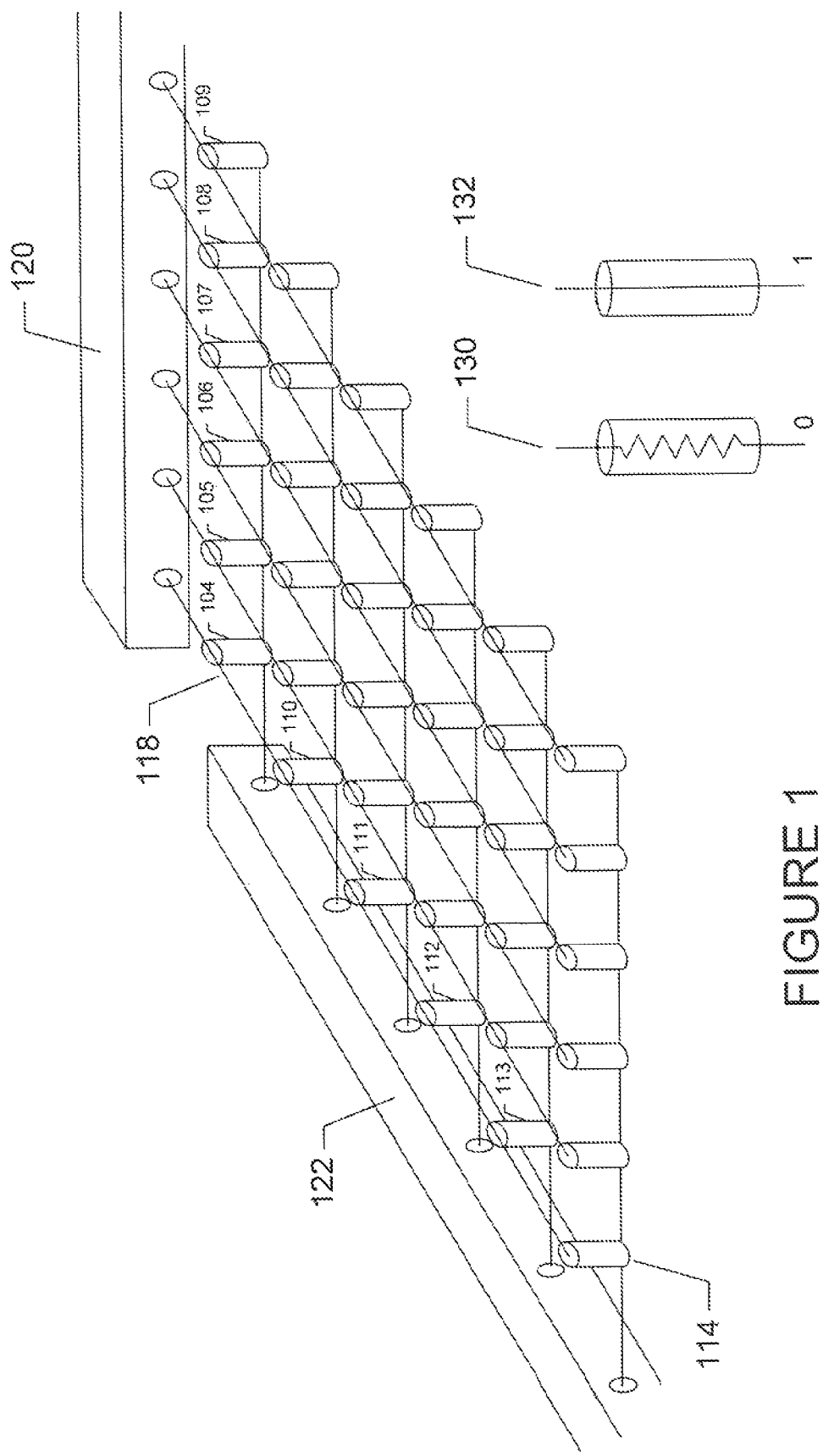
FIG. 1 illustrates a new type of electronic data-storage device that has been recently developed.

FIG. 1 illustrates a new type of electronic data-storage device that has been recently developed. The device shown in FIG. 1 is a two-dimensional array of memory elements, each element of which, such as element 102, can store a single bit of information. Each memory element is connected to a row signal line, such as the row of memory elements 104-109 in FIG. 1 connected to row signal line 103, and a column signal line, such as the column of memory elements 104 and 110-114 connected to column signal line 118. The column signal lines emanate from a column demultiplexer 120 and the row signal lines emanate from a row demultiplexer 122. A given memory element can be accessed by controlling the voltage states of the column signal line and row signal line to which the memory element is connected. In resistor-based or memristor-based memory arrays, the memory elements may reside in one of at least two different states 130 and 132 distinguishable by the electrical resistance of the memory element. For example, as shown in FIG. 1, when a memory element is in the high-resistance state 130, the memory element is considered to store a bit value "0," and when the memory element is in the low-resistance state 132, the memory element is considered to store the bit value "1." Of course, the opposite convention can be used, in which the low-resistance state is considered to represent bit value "0" and the high-resistance state is considered to represent bit value "1." In general, memory elements are read by applying low voltages across the memory elements and detecting the presence or absence of current flow greater than a relatively low, threshold value. Memory elements are written by applying large positive or negative voltages across the memory elements in order to change the electrical resistance of the memory element.

Figure 2:
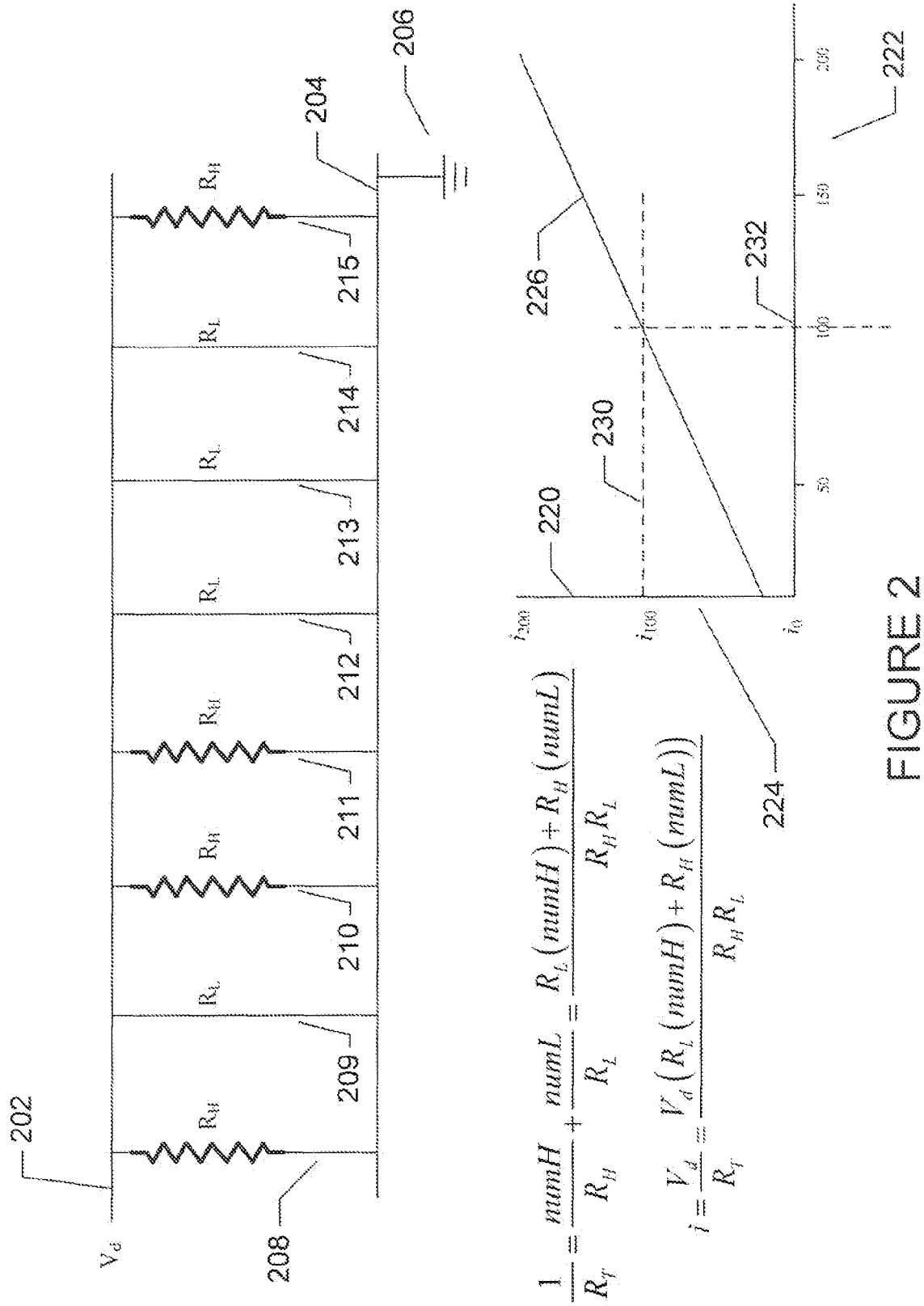
FIG. 2 illustrates a constraint encountered in electrical-resistance-based memories.

FIG. 2 illustrates a constraint encountered in electrical-resistance-based memories. In FIG. 2, a column of memory elements within a two-dimensional resistor-based memory array is shown. Signal line 202 is the column signal line and the lower line 204 represents the plain row signal lines, all of which are pulled to ground 206. The column signal line 202 is placed at voltage $V_d$ with respect to ground. The eight memory elements 208-215 are either in a high-resistance state with resistance $R_H$, such as memory element 208, or in a low-resistance state, with resistance $R_L$, such as memory element 209. The current passing through the column signal line 202 can be computed in terms of the number of memory elements in the high-resistance state, numH, and the number of memory elements in the low resistance state, numL, as follows:

$$\frac{1}{R_T} = \frac{numH}{R_H} + \frac{numL}{R_L} = \frac{R_L(numH) + R_H(numL)}{R_H R_L}$$

$$i = \frac{V_d}{R_T} = \frac{V_d(R_L(numH) + R_H(numL))}{R_H R_L}$$

Note that the above expressions hold for columns with an arbitrary number of memory elements. A plot of the current i, plotted with respect to a vertical axis 220, versus the number of memory elements in a column or row of a two-dimensional resistor-based memory array in the low-resistance state, plotted with respect to the horizontal axis 222, is shown in graph 224 in FIG. 2. The current-versus-number-of-low-resistance-memory-element curve in graph 224 is linear 226. The column or row for which the curve is shown in graph 224 contains 200 memory elements, and the current ranges from $i_0$ to $i_{200}$ as numL increases from 0 to 200 and numH decreases from 200 to 0.

A problem encountered in certain types of resistance-based memory arrays, particularly those with nanoscale components, is that when too many memory elements are in the low-resistance state, the current flow through a column signal line or row signal line that interconnects them may be sufficiently high to damage or destroy the signal line and the memory array containing the signal line, and, even when not sufficiently high to destroy the signal line, may be sufficiently high to induce various unwanted current paths through unselected memory elements. Thus; as also shown in graph 224 in FIG. 2, a memory array may be constrained to store data that can be represented in the array with no more than a threshold number of memory elements in any row or column in the low-resistance state at any particular point in time. As an example, in graph 224, the current $i_{100}$ 230 represents the highest current that can be safely carried by a column signal line or row signal line, corresponding to 100 memory elements 232 out of 200 memory elements being in the low-resistance state.

FIG. 3 illustrates conventions used in subsequent discussion of embodiments of the present invention. The data state of a physical, two-dimensional memory array 302 can be represented as a two-dimensional array of bit values 304, with each bit value corresponding to the resistance state of a single memory element. The two-dimensional bit array 304 can be alternatively viewed as a one-dimensional vector 306 in which the bit values in the two-dimensional array are ordered according to an arbitrary but deterministic ordering scheme. For example, in FIG. 3, the bit vector 306 is constructed as the concatenation of successive rows of the two-dimensional bit array 304, starting with the top-most row, in right-to-left order. Embodiments of the present invention are directed to encoding input information into two-dimensional-array codewords, referred to as "array codewords," or one-dimensional-array codewords, referred to as "vector codewords," that correspond to the memory elements in a physical two-dimensional memory array such that each vector codeword contains a number of bits with value "1" fewer than, or equal to, a threshold number and no row or column of any array codeword has more than a threshold number of bits with value "1." An equivalent constraint is to choose a threshold number one greater than the maximum allowed number of bits with value "1," and to ensure that each vector codeword contains a number of bits with value "1" fewer than the threshold number Description of Selected Error-Control Encoding Techniques Embodiments of the present invention employ concepts derived from well-known techniques in error-control encoding. An excellent reference for this field is the textbooks "Error Control Coding: Fundamentals and Applications," Lin and Costello, Prentice-Hall, Incorporated, New Jersey, 1983 and "Introduction to Coding Theory," Ron M. Roth, Cambridge University Press, 2006. In this subsection, a brief description of the error-detection and error-correction techniques used in error-control coding are described. Additional details can be obtained from the above-referenced textbooks, or from many other textbooks, papers, and journal articles in this field. The current subsection represents a concise description of certain types of error-control encoding techniques.

Error-control encoding techniques systematically introduce supplemental bits or symbols into plain-text messages, or encode plain-text messages using a greater number of bits or symbols than absolutely required, in order to provide information in encoded messages to allow for errors arising in storage or transmission to be detected and, in some cases, corrected. One effect of the supplemental or more-than-absolutely-needed bits or symbols is to increase the distance between valid codewords, when codewords are viewed as vectors in a vector space and the distance between codewords is a metric derived from the vector subtraction of the codewords.

In describing error detection and correction, it is useful to describe the data to be transmitted, stored, and retrieved as one or more messages, where a message $\mu$ comprises an ordered sequence of symbols, $\mu_i$, that are elements of a field F. A message $\mu$ can be expressed as:

$$\mu=(\mu_0,\mu_1,\ldots \mu_{k-1})$$

where $\mu_i \in F$.

The field F is a set that is closed under multiplication and addition, and that includes multiplicative and additive inverses. It is common, in computational error detection and correction, to employ finite fields, $GF(p^m)$, comprising a subset of integers with size equal to the power m of a prime number p, with the addition and multiplication operators defined as addition and multiplication modulo an irreducible polynomial over $GF(p)$ of degree m. In practice, the binary field $GF(2)$ or a binary extension field $GF(2^m)$ is commonly employed, and the following discussion assumes that the field $GF(2)$ is employed. Commonly, the original message is encoded into a message c that also comprises an ordered sequence of elements of the field $GF(2)$, expressed as follows:

$$c=(c_0,c_1,\ldots c_{n-1})$$

where $c_i \in GF(2)$.

Block encoding techniques encode data in blocks. In this discussion, a block can be viewed as a message $\mu$ comprising a fixed number of symbols k that is encoded into a message c comprising an ordered sequence of n symbols. The encoded message c generally contains a greater number of symbols than the original message $\mu$, and therefore n is greater than k. The r extra symbols in the encoded message, where r equals n−k, are used to carry redundant check information to allow for errors that arise during transmission, storage, and retrieval to be detected with an extremely high probability of detection and, in many cases, corrected.

In a linear block code, the $2^k$ codewords form a k-dimensional subspace of the vector space of all n-tuples over the field $GF(2)$. The Hamming weight of a codeword is the number of non-zero elements in the codeword, and the Hamming distance between two codewords is the number of elements in which the two codewords differ. For example, consider the following two codewords a and b, assuming elements from the binary field:

a=(1 0 0 1 1)
b=(1 0 0 0 1)

The codeword a has a Hamming weight of 3, the codeword b has a Hamming weight of 2, and the Hamming distance between codewords a and b is 1, since codewords a and b differ only in the fourth element. Linear block codes are often designated by a three-element tuple [n, k, d], where n is the codeword length, k is the message length, or, equivalently, the base-2 logarithm of the number of codewords, and d is the minimum Hamming distance between different codewords, equal to the minimal-Hamming-weight, non-zero codeword in the code.

The encoding of data for transmission, storage, and retrieval, and subsequent decoding of the encoded data, can be notationally described as follows, when no errors arise during the transmission, storage, and retrieval of the data:

$$\mu \rightarrow c(s) \rightarrow c(r) \rightarrow \mu$$

where c(s) is the encoded message prior to transmission, and c(r) is the initially retrieved or received, message. Thus, an initial message $\mu$ is encoded to produce encoded message c(s) which is then transmitted, stored, or transmitted and stored, and is then subsequently retrieved or received as initially received message c(r). When not corrupted, the initially received message c(r) is then decoded to produce the original message $\mu$. As indicated above, when no errors arise, the originally encoded message c(s) is equal to the initially received message c(r) and the initially received message c(r) is straightforwardly decoded, without error correction, to the original message $\mu$.

When errors arise during the transmission, storage, or retrieval of an encoded message, message encoding and decoding can be expressed as follows:

$$\mu(s) \rightarrow c(s) \rightarrow c(r) \rightarrow \mu(r)$$

Thus, as stated above, the final message $\mu(r)$ may or may not be equal to the initial message $\mu(s)$, depending on the fidelity of the error detection and error correction techniques employed to encode the original message $\mu(s)$ and decode or reconstruct the initially received message c(r) to produce the final received message $\mu(r)$. Error detection is the process of determining that:

$$c(r) \neq c(s)$$

while error correction is a process that reconstructs the initial, encoded message from a corrupted initially received message:

$$c(r) \rightarrow c(s)$$

The encoding process is a process by which messages, symbolized as $\mu$, are transformed into encoded messages c. Alternatively, a message $\mu$ can be considered to be a word comprising an ordered set of symbols from the alphabet consisting of elements of F, and the encoded messages c can be considered to be a codeword also comprising an ordered set of symbols from the alphabet of elements of F. A word $\mu$ can be any ordered combination of k symbols selected from the elements of F, while a codeword c is defined as an ordered sequence of n symbols selected from elements of F via the encoding process:

$$\{c:\mu \rightarrow c\}$$

Linear block encoding techniques encode words of length k by considering the word $\mu$ to be a vector in a k-dimensional vector space, and multiplying the vector $\mu$ by a generator matrix, as follows:

$$c=\mu \cdot G$$

Notationally expanding the symbols in the above equation produces either of the following alternative expressions:

$$(c_0, c_1, \ldots, c_{n-1}) = (\mu_0, \mu_1, \ldots, \mu_{k-1}) \begin{pmatrix} g_{00} & g_{01} & g_{02} & \cdots & g_{0,n-1} \\ \vdots & & \ddots & & \vdots \\ g_{k-1,0} & g_{k-1,1} & g_{k-1,2} & \cdots & g_{k-1,n-1} \end{pmatrix}$$

$$(c_0, c_1, \ldots, c_{n-1}) = (\mu_0, \mu_1, \ldots, \mu_{k-1}) \begin{pmatrix} g_0 \\ g_1 \\ \vdots \\ \vdots \\ g_{k-1} \end{pmatrix}$$

where $g_i=(g_{i,0}, g_{i,1}, g_{i,2}, \ldots g_{i,n-1})$.

The generator matrix G for a linear block code can have the form:

$$G_{k,n} = \begin{pmatrix} p_{0,0} & p_{0,1} & \ldots & p_{0,r-1} & 1 & 0 & 0 & \ldots & 0 \\ p_{1,0} & p_{1,1} & \ldots & p_{1,r-1} & 0 & 1 & 0 & \ldots & 0 \\ \ldots & \ldots & \ldots & & 0 & 0 & 1 & \ldots & 0 \\ \ldots & \ldots & \ldots & & \ldots & \ldots & \ldots & \ldots & \ldots \\ \ldots & \ldots & \ldots & & \ldots & \ldots & \ldots & \ldots & \ldots \\ p_{k-1,0} & p_{k-1,1} & \ldots & p_{k-1,r-1} & 0 & 0 & 0 & \ldots & 1 \end{pmatrix}$$

or, alternatively:

$$G_{k,n} = [P_{k,r} | I_{k,k}]$$

Thus, the generator matrix C can be placed into a form of a matrix P augmented with a k by k identity matrix $I_{k,k}$. Alternatively, the generator matrix G can have the form:

$$G_{k,n} = [I_{k,k} | P_{k,r}]$$

A code generated by a generator matrix in this form is referred to as a "systematic code." When a generator matrix having the first form, above, is applied to a word p, the resulting codeword c has the form:

$$c = (c_0, c_1, \ldots, c_{r-1}, \mu_0, \mu_1, \ldots, \mu_{k-1})$$

where $c_i = \mu_0 p_{0,i} + \mu_1 p_{1,i}, \ldots, \mu_{k-1} p_{k-1,i}$. Using a generator matrix of the second form, codewords are generated with trailing parity-check bits. Thus, in a systematic linear block code, the codewords comprise r parity-check symbols $c_i$ followed by the k symbols comprising the original word μ or the k symbols comprising the original word μ followed by r parity-check symbols. When no errors arise, the original word, or message μ, occurs in clear-text form within, and is easily extracted from, the corresponding codeword. The parity-check symbols turn out to be linear combinations of the symbols of the original message, or word μ.

One form of a second, useful matrix is the parity-check matrix $H_{r,n}$ defined as:

$$H_{r,n} = [I_{r,r} | -P^T]$$

or, equivalently, $$H_{r,n} = \begin{pmatrix} 1 & 0 & 0 & \ldots & 0 & -p_{0,0} & -p_{1,0} & -p_{2,0} & \ldots & -p_{k-1,0} \\ 0 & 1 & 0 & \ldots & 0 & -p_{0,1} & -p_{1,1} & -p_{2,1} & \ldots & -p_{k-1,1} \\ 0 & 0 & 1 & \ldots & 0 & -p_{0,2} & -p_{1,2} & -p_{2,2} & \ldots & -p_{k-1,2} \\ \ldots & \ldots & \ldots & \ldots & \ldots & \ldots & \ldots & \ldots & & \ldots \\ 0 & 0 & 0 & \ldots & 1 & -p_{0,r-1} & -p_{1,r-1} & -p_{2,r-1} & \ldots & -p_{k-1,r-1} \end{pmatrix}$$

The parity-check matrix can be used for systematic error detection and error correction. Error detection and correction involves computing a syndrome S from an initially received or retrieved message c(r) as follows:

$$S = (s_0, s_1, \ldots, s_{r-1}) = c(r) \cdot H^T$$

where $H^T$ is the transpose of the parity-check matrix $H_{r,n}$ expressed as:

$$H^T = \begin{pmatrix} 1 & 0 & 0 & \ldots & 0 \\ 0 & 1 & 0 & \ldots & 0 \\ 0 & 0 & 1 & \ldots & 0 \\ \ldots & \ldots & \ldots & \ldots & 1 \\ -p_{0,0} & -p_{0,1} & -p_{0,2} & \ldots & -p_{0,r-1} \\ -p_{1,0} & -p_{1,1} & -p_{1,2} & \ldots & -p_{1,r-1} \\ -p_{2,0} & -p_{2,1} & -p_{2,2} & \ldots & -p_{2,r-1} \\ \ldots & \ldots & \ldots & \ldots & \ldots \\ -p_{k-1,0} & -p_{k-1,1} & -p_{k-1,2} & \ldots & -p_{k-1,r-1} \end{pmatrix}$$

Note that, when a binary field is employed, x=−x, so the minus signs shown above in $H^T$ are generally not shown.

The syndrome S is used for error detection and error correction. When the syndrome S is the all-0 vector, no errors are detected in the codeword. When the syndrome includes bits with value "1," errors are indicated. There are techniques for computing an estimated error vector ê from the syndrome and codeword which, when added by modulo-2 addition to the codeword, generates a best estimate of the original message μ. Details for generating the error vector ê are provided in the above mentioned texts. Note that only up to some maximum number of errors can be detected, and fewer than the maximum number of errors that can be detected can be corrected.

Embodiments of the Present Invention

As discussed above, embodiments of the present invention are directed to encoding and decoding techniques for coding information to be stored in memory arrays and memory vectors and decoding information retrieved from memory arrays and memory vectors, with the codewords produced by coding embodiments of the present invention satisfying the above-discussed data constraint. For example, the constraint may specify that no row or column in a two-dimensional bit-matrix codeword can have a Hamming weight greater than a threshold value. In examples used to illustrate embodiments of the present invention, square-matrix codewords may be constrained to have no column or row with a Hamming weight greater than n/2, where n is the row or column dimension of the matrix and "/" indicates integer division.

Figure 4B:
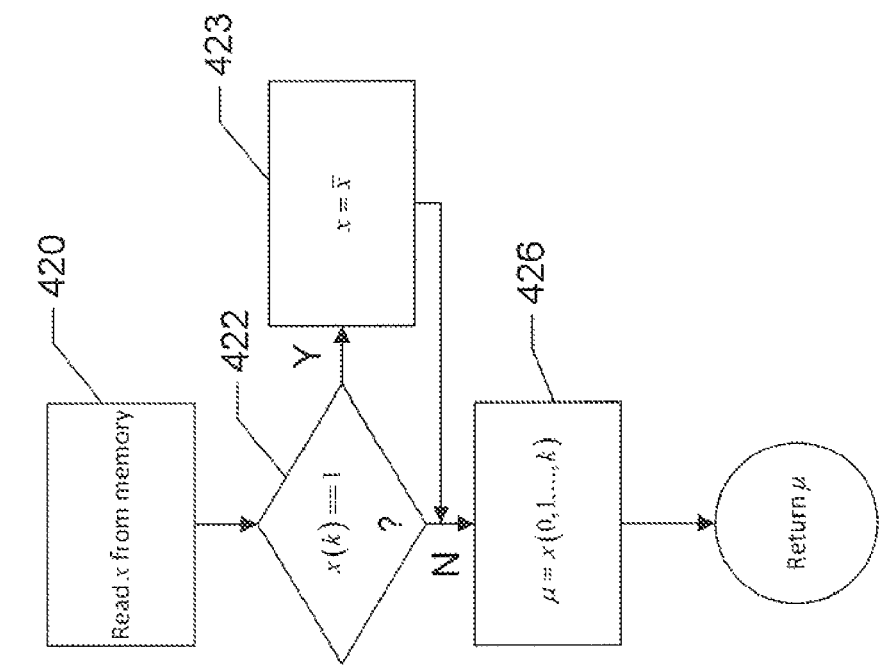
FIGS. 4A-B illustrate one approach to encoding information, for storage in a vector memory that satisfies a Hamming-weight constraint, according to one embodiment of the present invention.
Figure 4A:
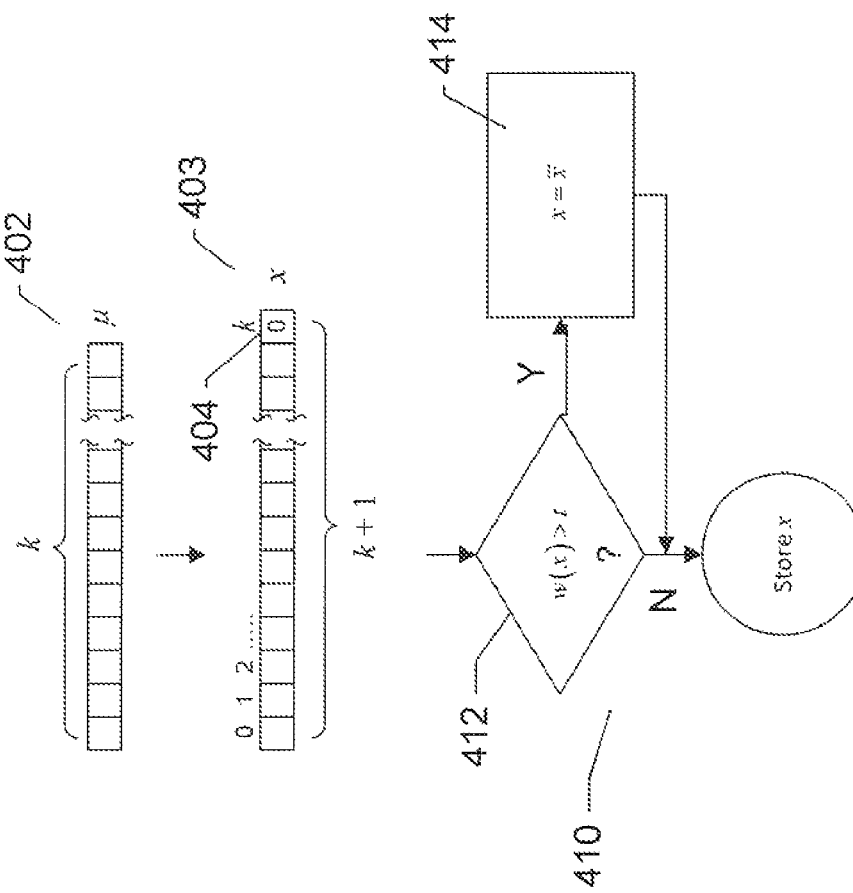

FIGS. 4A-B illustrate one approach to encoding information, for storage in a vector memory that satisfies a Hamming-weight constraint, according to one embodiment of the present invention. As shown in FIG. 4A, k information bits within a vector u 402 are encoded into a vector x 403 of length k+1. The final entry 404 in vector x, with index k, is set to 0. This final bit serves as a flag that indicates whether or not a bitwise-complement operation has been carried out on the vector in subsequent steps that are next described. The lower portion of FIG. 4A 410 illustrates, in control-flow-diagram fashion, a final encoding step. When the Hamming weight of vector x is greater than a threshold value t, such as (k+1)/2, as determined in step 412, then vector x is inverted by a bitwise-complement operation in step 414. Thus, either the original information bits are used in the encoded vector x, or the original information bits are inverted, so that the final Hamming weight of the encoded vector x is less than or equal to the threshold value t. The threshold t can be set to (k+1)/2, where "/" refers to integer division, or to larger values, and the encoding procedure shown in FIG. 4A successfully encodes any input vector u.

FIG. 4B shows the decoding method that is used to decode information encoded by the encoding method shown in FIG. 4A. A vector x is read back from memory, in step 420. When the final bit, with index k, in the vector x is equal to "1," as determined in step 422, then x is inverted by a bitwise-complement operation in step 423. Finally, in step 426, the information-bit vector u is set to the first k entries in x.

While the encoding and decoding method that represents one embodiment of the present invention, discussed above with reference to FIGS. 4A-B, does allow for encoding of information bits in compliance with a Hamming-weight constraint, the methods suffer from disadvantages when errors occur in storage, or while a codeword x is being written to, or read from, a vector memory. For example, when the final bit of the encoded vector x is erroneously inverted, the resulting decoded vector u is generally quite different, in bit values, from the original, input information bits.

A second encoding and decoding method that represents another embodiment of the present invention is based on identifying a generator matrix G for a linear block code:

$$x = u \cdot G$$

where
u=information bits;
G=generator; and
x=codeword corresponding to u with the properties that:

$$\forall u, w(x) \leq 1$$

$$\forall u, u' \neq u, |w(u-u')| \in |w(x-x')|$$

where
x=u·C;
x'=u'·G;
vector subtraction is modulo 2, w(x) is the Hamming weight of vector x; and $$\frac{1}{\alpha} < \varepsilon < \alpha$$

In other words, input vectors corresponding to codewords that are close in Hamming distance are also close in Hamming distance, and the weights of the codewords generated from any input vector u are below some threshold value t. It is possible, for encoding input vectors of relatively short lengths, to identify such codes by computational-search methods. Longer codes can be composed by sequentially arranging codewords of shorter codes.

Figures 5A, 5B:
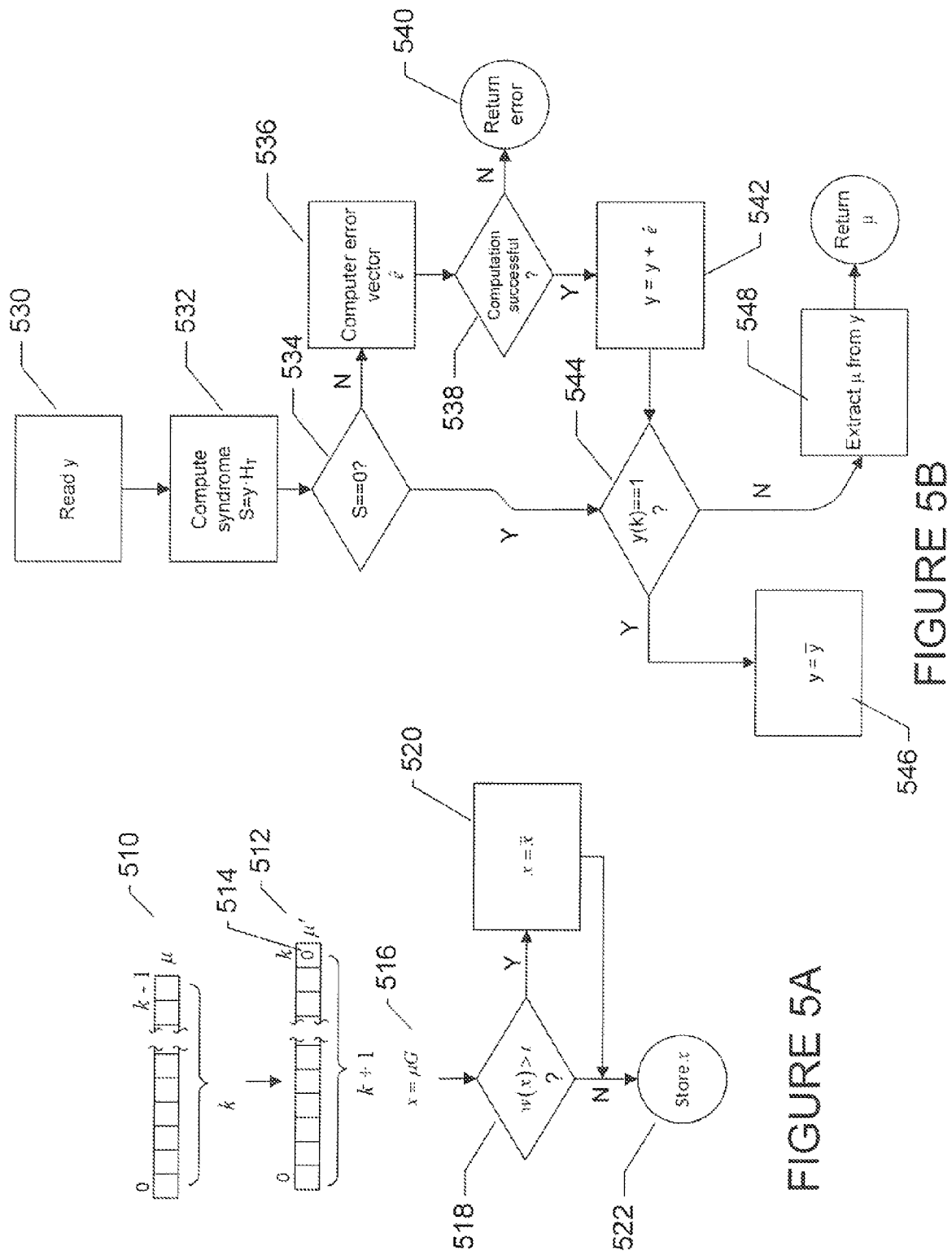
FIGS. 5A-B illustrate a third embodiment of the present invention for encoding information for storage in a vector memory and for decoding coded information read from the vector memory.

FIGS. 5A-B illustrate a third embodiment of the present invention for encoding information for storage in a vector memory and for decoding coded information read from the vector memory. The method of the third embodiment is similar to that of the first embodiment of the present invention, described above with reference to FIGS. 4A-B, but additionally employs error-control coding and associated parity bits to enable a certain number of errors to be detected and corrected. The third embodiment of the present invention employs a linear [n,k+1,d] code with the property that the vector containing only bits with value "1" is a codeword. Such a code can be partitioned into two equal parts, the codewords in a first part containing the bitwise complements of the codes in the second part. Let G be a systematic generator matrix of the second form for such a code. An input vector u with k input bits 510 is placed into a modified input vector u' 512 with k+1 elements, the last element of which 514 is set to bit value "0." This vector is then multiplied by the generator matrix to produce an encoded vector x 516. The remaining portion of FIG. 5A and all of FIG. 5B are illustrated using control-flow-diagram illustration conventions. When x has a Hamming weight greater than a threshold value, as determined in step 518, the encoded vector x is inverted by bitwise complementation in step 520. The vector x can then be stored in a vector memory 522. The bit with index k, subsequently serves as a flag to indicate whether or not encoded vector x has been inverted by a bitwise-complement operation.

FIG. 5B illustrates the decoding method of the present invention corresponding to the encoding method of the present invention illustrated in FIG. 5A. In step 530, a vector y is read from a single-vector memory. Then, in step 532, the syndrome corresponding to the vector y is generated, as discussed in the preceding section. When the syndrome is not the 0 vector, as determined in step 534, an estimate of the error vector c is computed, in step 536. When computation of the estimate of the error vector is not successful, as determined in step 538, an error is returned in step 540. Otherwise, in step 542, a decoded vector y is computed by adding the estimated error vector to the read vector y read from the memory, where the addition is bitwise modulo-2 addition. In step 544, the decoding method determines whether or not the bit with index k in the decoded vector has bit value "1." When the bit has bit value "1," as determined in step 544, the encoded vector was inverted by a bitwise-complement operation during encoding, in step 520 of FIG. 5A. Therefore, in step 546, a second bitwise-complement operation is carried out to re-invert the decoded vector, restoring the vector to its original form, computed in step 516 of FIG. 5A. Finally, in step 548, the information-bit vector u is extracted from the decoded vector y by inverting the first step of the encoding method, and the information-bit vector u is returned.

The encoding and decoding methods illustrated in FIGS. 5A-B, which represent embodiments of the present invention, have certain desirable features. Encoded-vector inversion by bitwise complementation ensures that encoded vectors comply with the Hamming-weight constraint, namely having Hamming weights less than a threshold weight 1. Encoding of the modified information-bit vector u' using generator matrix G introduces additional parity bits that are subsequently used, on decoding, to detect and correct up to a maximum number of errors. As discussed in the preceding section, the number of errors that can be detected is generally greater than the number of errors that can be both detected and corrected.

Figure 6A:
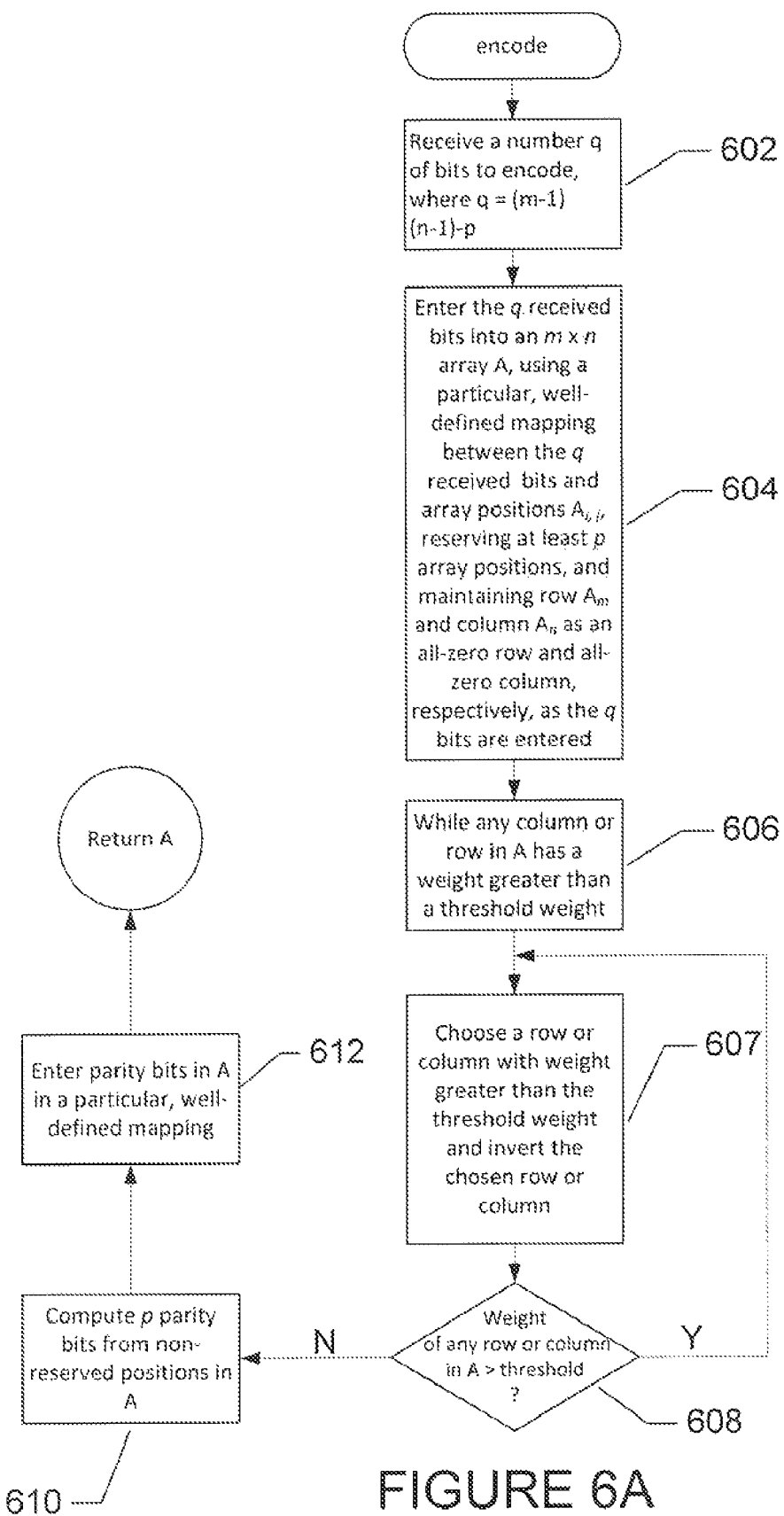
FIGS. 6A-B provide control-flow diagrams for a method and system embodiment of the present invention directed to an encoder for encoding information into two-dimensional array codewords for storage in array memories and for decoding two-dimensional-array codewords.
Figure 6B:
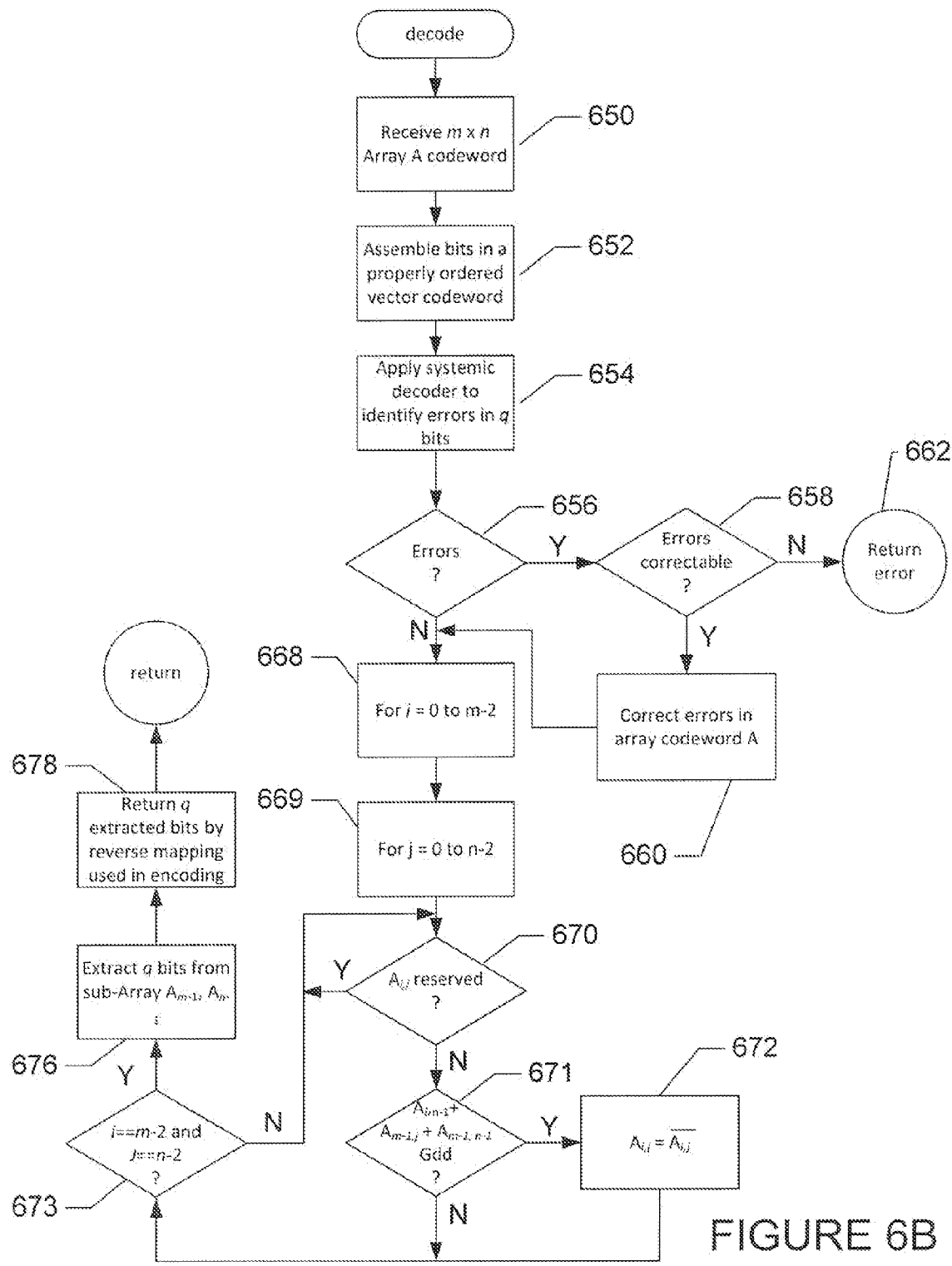

FIGS. 6A-B provide control-flow diagrams for a method and system embodiment of the present invention directed to an encoder for encoding information into two-dimensional-array codewords for storage in array memories and for decoding two-dimensional-array codewords. The method and system described with references to FIGS. 6A-B uses both a column-and-row-inversion technique, to ensure that codewords satisfy row and column constraints, discussed above, and error-control-coding techniques that systematically generate parity bits. In step 602 of FIG. 6A, the encoding method receives a number q information bits for encoding into an array codeword. The number q is a number that can be expressed as:

$$q = (m-1)(n-1) - p$$

where m is the number of rows in the two-dimensional memory;

n is the number of columns in the two-dimensional memory; and p is a number of parity bits generated for inclusion in the two-dimensional-array codeword.

Next, in step 604, the q received information bits are arranged within an m×n array A, using a well-defined mapping between an ordered, vector representation of the input q bits and the bit positions within array A. Within array A, p positions are reserved for the parity bits, and are referred to as "reserved bits," and the final row and final column of array A are initialized to contain only bits with value "0." As discussed in greater detail, below, the parity bits are distributed within the array so that, even were all the parity bits equal to "1," the array would nonetheless comply with the Hamming constraint for the columns and rows of the array. Note that, the arrangement of information bits and 0-valued bits in memory may be different from the logical arrangement, and the logical arrangement obtained by programmatic retrieval of bits in a particular order during array-based operations. Next, in a while-loop comprising steps 606-608, a row or column in matrix A with a Hamming weight greater than a threshold weight % is selected, assuming the reserved R positions are 1's, in each iteration of the while-loop, and inverted in all non-reserved positions using bitwise-complement operations until no column or row in array A has a weight greater than the threshold weight. Next, in step 610, values of the p parity bits are computed from all but the reserved bits in array A, using a systematic code, and finally, in step 612, the computed parity bits are placed into the reserved positions of the array A to complete construction of the array codeword A. The codeword can be stored in a two-dimensional resistor-based memory without violating the row and column constraints.

In FIG. 6A, it is assumed that there is a single threshold Hamming-weight constraint, represented by threshold value t that applies both to columns and rows of array A. In alternative embodiments of the present invention, different threshold values $t_r$ and $t_c$ may be applied to rows and columns, respectively, to reflect different constraints in the underlying two-dimensional resistor-based array. As is discussed in greater detail, below, the encoding method that represents one embodiment of the present invention discussed with reference to FIG. 6A is well suited for generating two-dimensional codewords in an array with dimensions m×n, where m and n are even, and row and column threshold values $t_{row}$ and $t_{column}$ are greater than or equal to n/2 and m/2, respectively, and p is less than or equal to the minimum of in and n. In this case, any q input bits can be successfully encoded by the method discussed above with reference to FIG. 6A. In other cases, the method is slightly altered, as discussed further below.

FIG. 6B provides a control-flow diagram for the decoding method that represents one embodiment of the present invention, corresponding to the encoding method discussed with reference to FIG. 6A. In step 650, an m×n two-dimensional-array codeword with possible errors, A, is received, in the current context after being read from a two-dimensional memory. Next, in step 652, the bits within the received array are re-organized into a vector codeword, reversing the coding step (604 in FIG. 6A) in which the information bits and 0-valued bits for the final column and row are assembled into a two-dimensional matrix. This step may be carried out programmatically, by retrieving values from the codeword in a particular order, rather than physically creating a vector corresponding to the array codeword. In step 654, a decoder corresponding to the systematic encoder employed in the encoder (step 610 of FIG. A) is applied to the received array in order to detect any errors that may have occurred during storing and retrieving the codeword from a two-dimensional memory. If any errors are detected, as determined in step 656, then when the errors are correctable, as determined in step 658, the errors are corrected in step 660. Otherwise, when the errors cannot be corrected by systematic decoding, an error is returned in step 662. Next, in the nested for-loop of steps 668-673, each bit in the codeword array, other than the bits in the final column and final row, are considered, one-by-one, and when the currently considered position does not correspond to a reserved position, or a parity bit, a sum of bits related to the currently considered bit is computed, in step 671. When the sum is equal to "1," then the currently considered bit is inverted in step 672. This method reverses the logical-complement operations carried out to ensure that all rows and columns comply with the Hamming-weight constraint, in the while-loop of steps 606-608 in FIG. 6A. This process is described, in greater detail, below. Next, in step 676, the q information bits are extracted from the codeword array and optionally reassembled into an information-bit vector in step 678.

Figure 7:
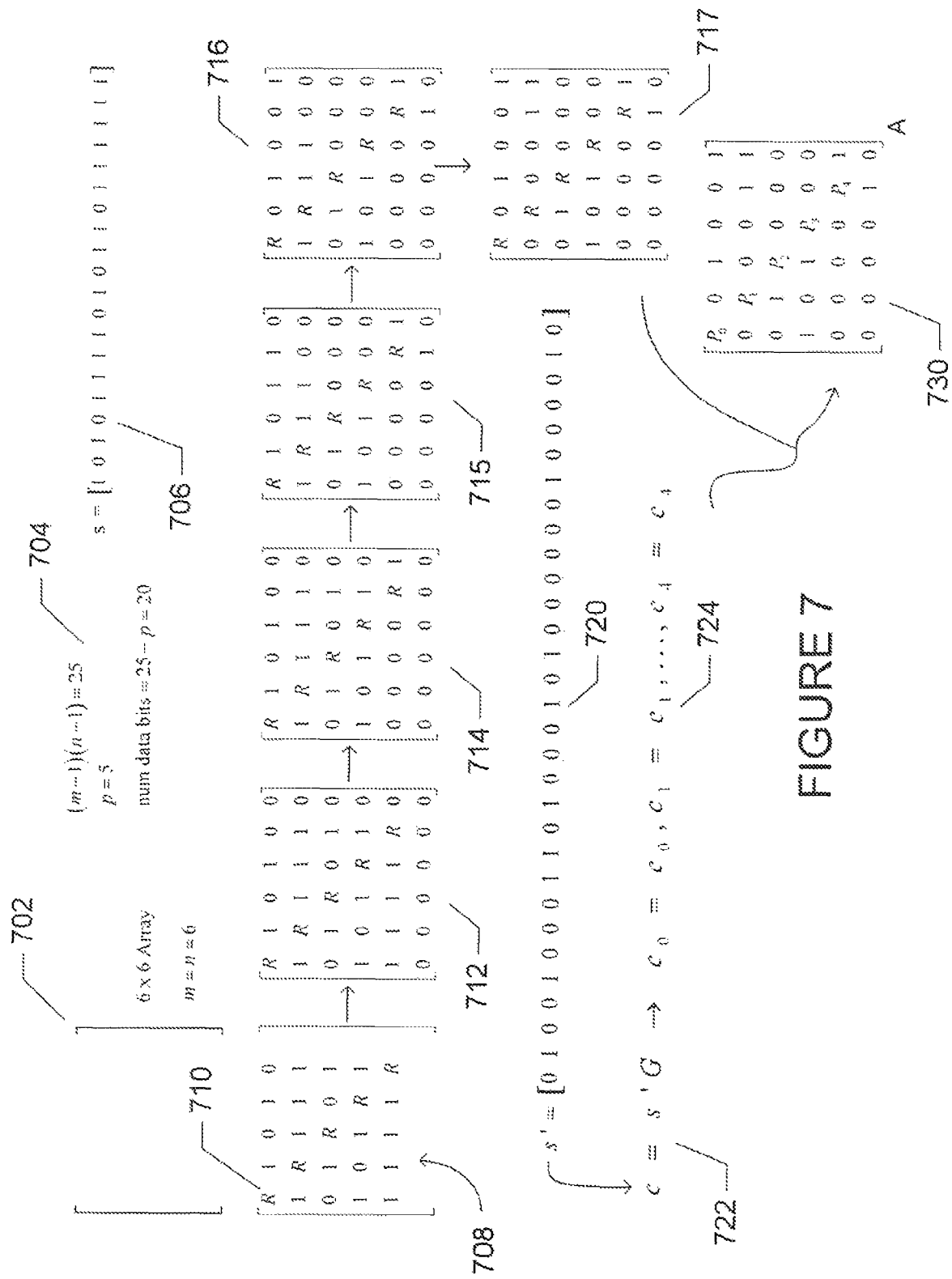
FIGS. 7-9 provide an example of information encoding and decoding using the encoding and decoding methods, which represent embodiments of the present invention, discussed above with reference to FIG. 6A-B.
Figure 8:
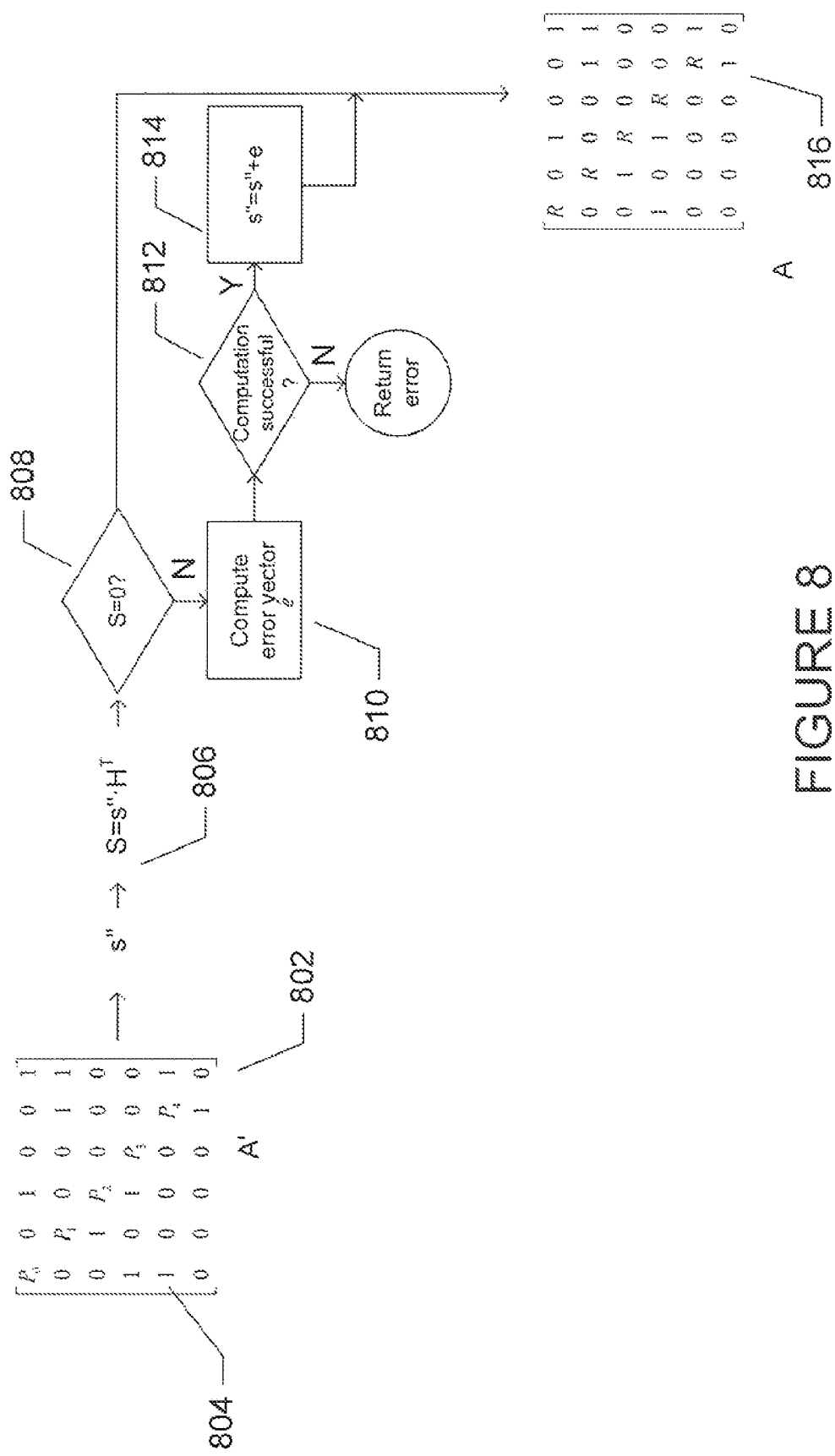
Figure 9:
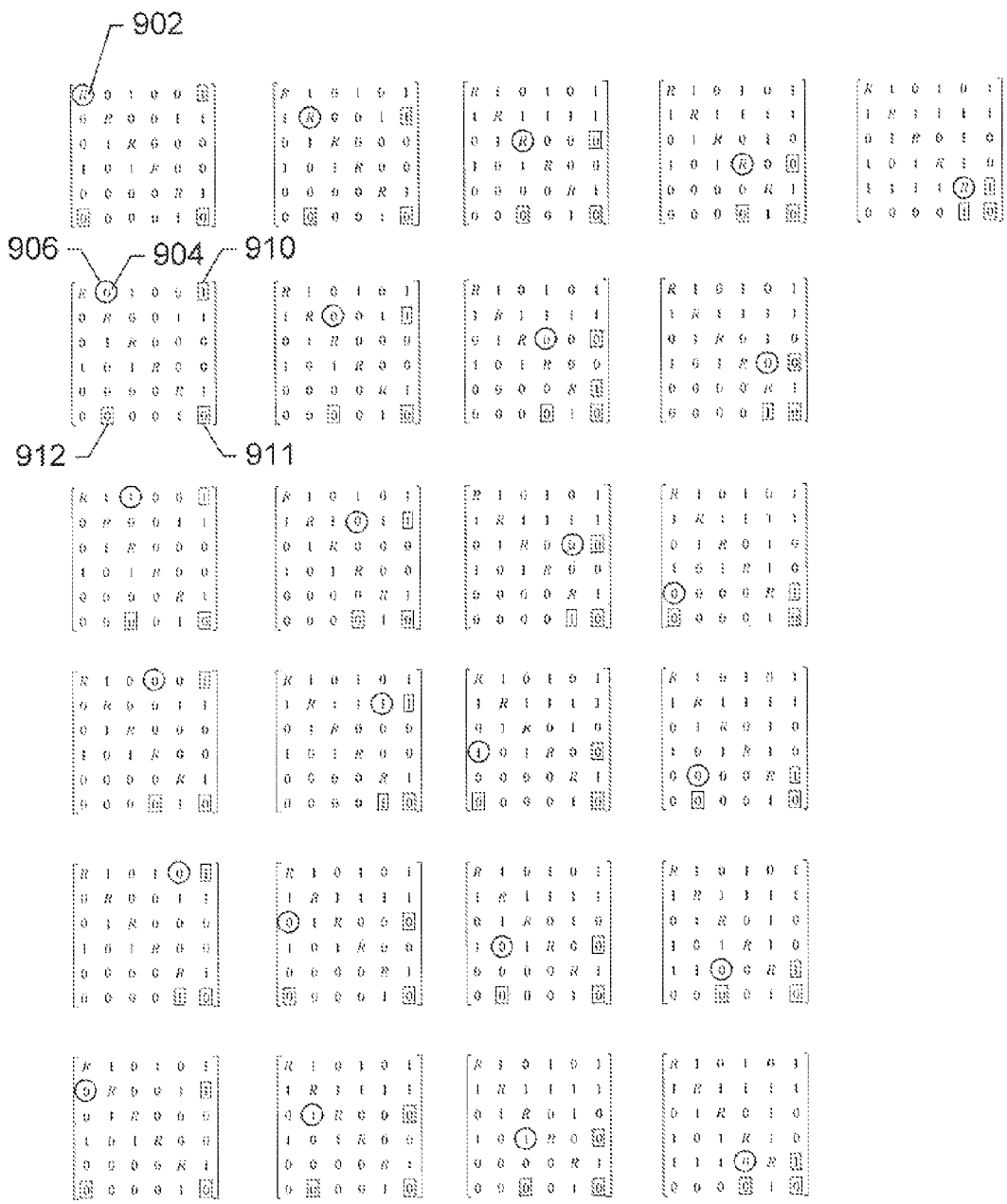

FIGS. 7-9 provide an example of information encoding and decoding using the encoding and decoding methods, which represent embodiments of the present invention, discussed above with reference to FIG. 6A-B. In this example, the two-dimensional codeword and underlying two-dimensional memory array are both 6×6 arrays 702, and thus m=n=6. The encoding and decoding methods demonstrated in the example of FIGS. 7-9 encode 20 bits of information and five parity bits into each 6×6 array codeword 704. In the example of FIGS. 7-9, 20 information bits are received as a vector s 706. First, the 20 information bits are assembled into all but the final column and final row of a 6×6 two-dimensional array codeword 708. Five bit positions within the array codeword, including the bit position 0,0 710, are marked with the symbol "R," to indicate these are positions reserved for parity bits, and are referred to as "reserved position." All other positions are non-reserved positions. The bits of the vector s are extracted, four bits at a time, for each successive row in the array codeword 708. Next, the last column and last row of the array codeword are set to bit value "0" 712.

Note that the parity bits are arranged along the main diagonal of the array codeword. This arrangement insures that each column and row contains only a single parity bit. As discussed above, with reference to FIG. 6, the non-reserved bits of the array codeword are input to a systematic encoder in order to compute the values for the parity buts, in the penultimate step 610 of FIG. 6A. Therefore, prior to that step, it needs to be guaranteed that, regardless of what value is assigned to each parity bit, no column or row of the array codeword will have more than n/2 or m/2, respectively, bits with value "1." In order to make this guarantee, the reserved positions are assumed to have a value "1," during the while-loop in which bitwise-complement operations are carried out until the Hamming-weight constraint is satisfied (606-608 in FIG. 6A). Since the threshold t is m/2, or 3, no row or column containing a reserved position, can have more than 2 bits with value "1," and no row or column without a reserved position can have more than 3 bits with value "1," prior to calculation of the parity-bit values. Because both m and n are even and equal, when a row or column has more than m/2 bits with value "1," inversion of the row or column necessarily produces a complementary row or column with less than m/2 bits, regardless of the value subsequently assigned to a parity bit in the row or column. However, in the case that a row or column length, m or n, is odd, then either the minimum Hamming-weight-constraint threshold needs to be m/2+1 or n/2+1, respectively, or any reserved positions need to be paired with an additional reserved 0-valued position and the minimum Hamming-weight-constraint threshold maintained at m/2 or n/2. The additional reserved positions are assumed to be 0 in the Hamming-weight computation and like the original reserved positions are unchanged during the inversion step of the row-column inversion loop (606-608).

Next, the row and column inversions are carried out, as in the while-loop of steps 606-608 in FIG. 6A. Intermediate array codewords 714-717 are generated by row and column inversion, with array codeword 717 satisfying the row and column Hamming constraint that no row or column should have more than three bits with value "1." For example, array codeword 714 is generated by inversion of the $5^{th}$ row of array codeword 712. Note, in intermediate array codeword 717, that the Hamming-weight constraint is satisfied even when all five parity bits, represented by the symbol "R," are set to bit value "1." Then, the non-reserved bits of the codeword are assembled into a modified vector s' 720 which is multiplied by a generator matrix G 722 of a systematic encoding method to produce a codeword c from which five parity bits are obtained 724. These parity bits are then inserted in the intermediate array codeword to produce a final array codeword 730. The vector s' may not necessarily be constructed in memory, but may only be logically constructed as bits are selected from array codeword 717 during the multiplication by generator matrix G 722.

FIGS. 8 and 9 illustrate the decoding portion of the example of FIGS. 7-9. An array A' 802 is read from a two-dimensional array memory in which the array codeword A 730 in FIG. 7 was stored. Note that the array A' 802 differs in bit position 804 from the array codeword A 730 in FIG. 7, due to an error that occurred during storage or retrieval of the array codeword. The mapping by which intermediate codeword 722 in FIG. 7 is mapped into final array codeword 730 is reversed, in a first step 806 of the decoding process, to produce vector s", and this vector is multiplied by the transpose of the parity-check matrix to produce a syndrome S. Again, vector s" may be simply a logical entity formed by selecting bits in an appropriate sequence from codeword array A'. When the syndrome S is the all-0 vector, as determined in step 808, no errors have occurred during storage and reading of the array codeword A'. Otherwise, an error vector ê is computed from the syndrome in step 810. When an estimated error vector ê can be successfully obtained, as determined in step 812, then errors are corrected by adding the error vector to the vector s", in step 814, to produce a systematic-decoder-corrected array codeword A 816. Note that, in FIG. 8, the corrected parity-check bits of the systematic-decoder-corrected array codeword A are replaced with the symbol "R," since the parity bits are no longer needed.

FIG. 9 illustrates column-and-row-inversion carried out during decoding and represented as nested for-loops 668-673 in FIG. 6B. In FIG. 9, the systematic-denoiser-corrected array codeword A (816 in FIG. 8) is shown at the top left of the figure, and the sequence of steps carried out in the nested for-loops of steps 668-673 in FIG. 6B are illustrated by successive versions of the array codeword corresponding to the currently considered version of the array codeword at the beginning of each iteration of the nested for-loop. For example, in the first iteration of the nested for-loop, bit 902 in the array codeword corresponds to bit $A_{0,0}$ considered in step 670 of FIG. 6B. Since this is a reserved position, the column index is incremented, and, in the next iteration of the nested for-loops, bit 904, which corresponds to $A_{0,1}$ in step 670 of FIG. 6B, is considered. In FIG. 9, the currently considered bit is inscribed within a circle 906. The bits related to the currently considered bit that are summed together, in step 671, are inscribed in squares 910-912. When the sum of these bits is "1," the currently considered bit is inverted. Otherwise, the currently considered bit is left unchanged. A full example of the inverse column-and-row-inversion decoding process is illustrated in the sequence of intermediate array codewords in FIG. 9, starting from the top, left-hand array codeword and moving downward, in the first column, and then resuming with the top array codeword in the next column to the right.

Figure 10:
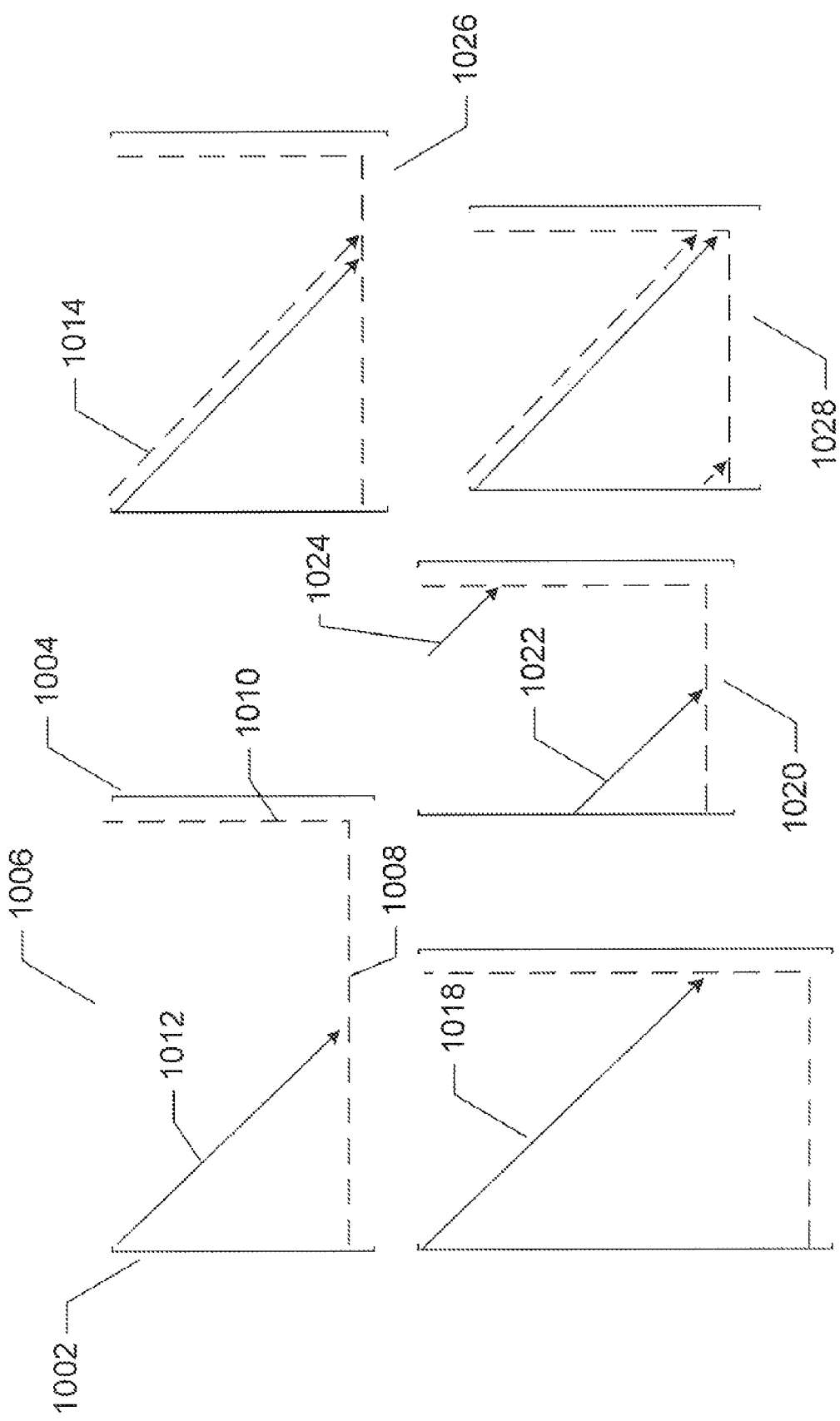
FIG. 10 illustrates variations in the placement of the parity bits into array codewords according to certain embodiments of the present invention.

FIG. 10 illustrates variations in the placement of the parity bits into array codewords according to certain embodiments of the present invention. In all of the depictions of array codewords in FIG. 10, as well as in FIG. 11, the codeword array is represented by a pair of angle brackets, such as angle brackets 1002 and 1004 for codeword array 1006, the last column and last row which contain all "0" values are set off by dashed lines, such as dashed line 1008 and 1010, parity-bit positions are represented by a solid diagonal arrow, such as solid diagonal arrow 1012, and additional 0-valued bit positions are represented by diagonal dashed arrows, such as diagonal dashed arrow 1014. The bit positions are not explicitly shown. Array codeword 1006 and array codeword 1016 illustrate that, when m and n are unequal, but both even, then parity bits can be assigned to bit positions along main array diagonals 1012 and 1018. In addition, as shown by array codeword 1020, rather than placing the parity bits along a main diagonal, the diagonal placement of parity bits can start at a different position within the array 1022 and wrap around to the top-most row 1024 of a next column. When either m or n is not even, the parity bits need to be accompanied by an additional 0-value bit in order to ensure the Hamming-weight constraint of the method discussed above with reference to FIGS. 6A-B is satisfied, when the threshold t is m/2 and/or n/2. Array codewords 1026 and 1028 illustrate placement of additional 0-valued bit for each parity bit.

Figure 11:
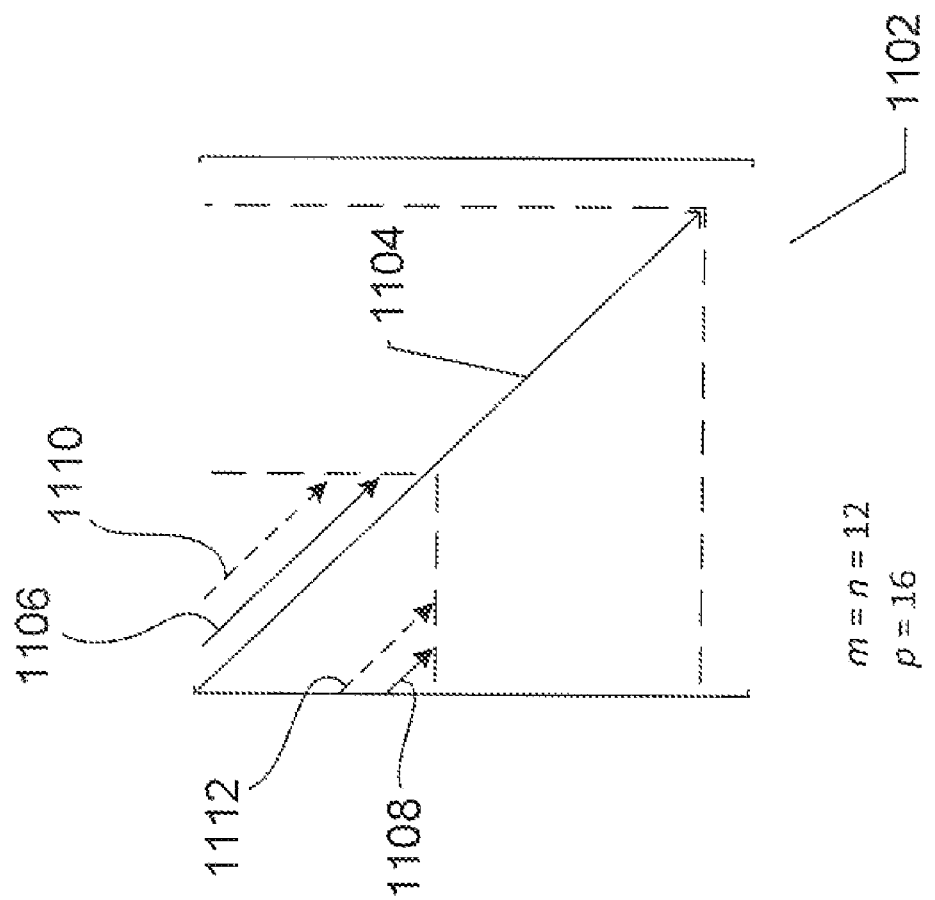
FIG. 11 shows a method for encoding more parity bits into an array codeword when the number of parity bits exceeds the minimum of the array dimensions m and n, according to one embodiment of the present invention.

FIG. 11 shows a method for encoding more parity bits into an array codeword when the number of parity bits exceeds the minimum of the array dimensions less one, m−1 and n−1, according to one embodiment of the present invention. As shown in FIG. 11, for an array codeword with m=n=12 1102, the first 12 parity bits can be entered along diagonal 1104 and four additional parity bits can be entered along diagonals 1106 and 1108, along with accompanying 0-valued bits 1110 and 1112. When more than one parity bit is entered into any column or row, an additional 0-valued bit needs to also be entered into the row or column, in order to maintain a minimum threshold t of m/2 and/or n/2.

Figure 12:
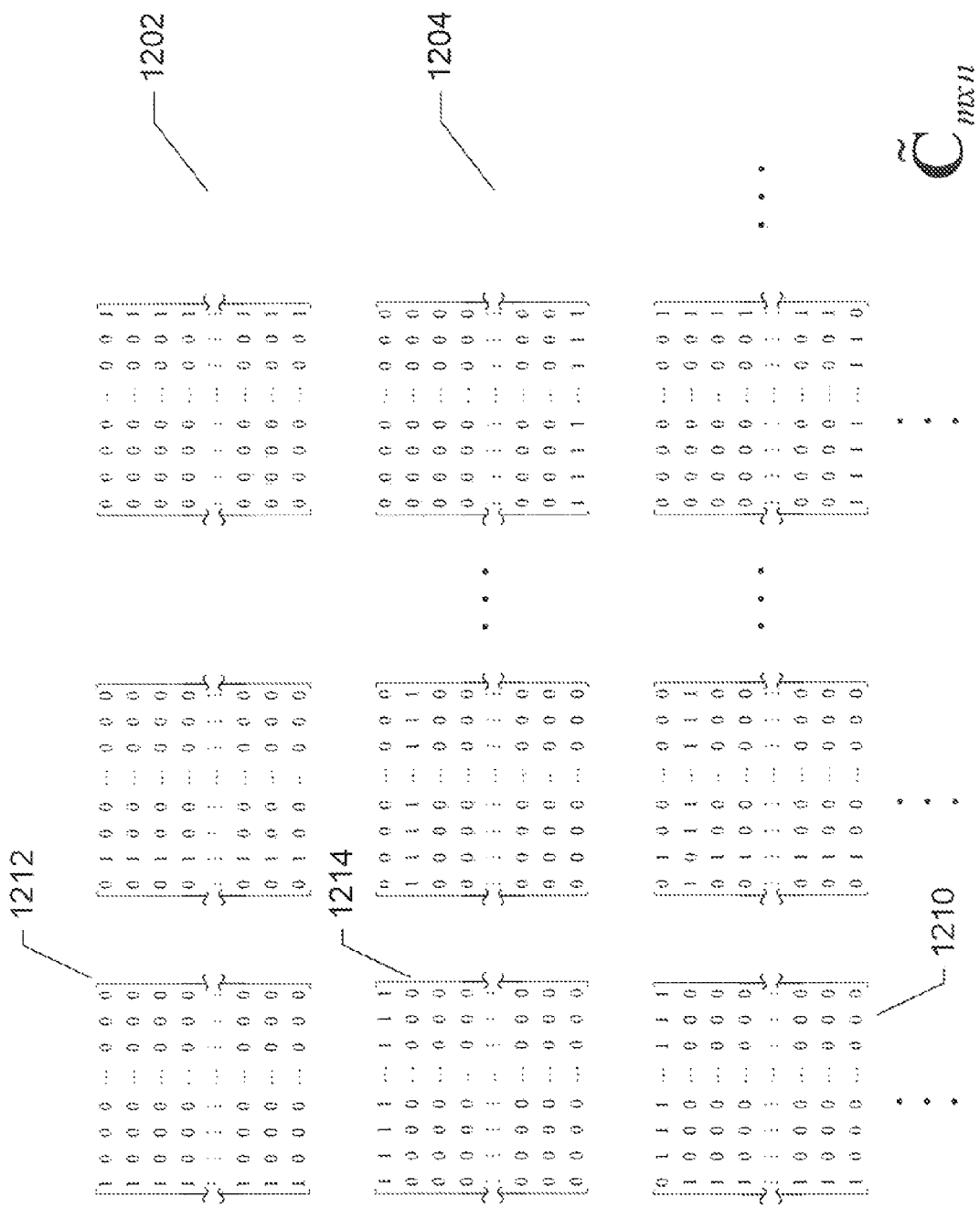
FIGS. 12-17 illustrate a family of method and system embodiments of the present invention for encoding information in two-dimensional array codewords and for decoding the two-dimensional array codewords.

FIGS. 12-17 illustrate a family of method and system embodiments of the present invention for encoding information in two-dimensional array codewords and for decoding the two-dimensional array codewords. In this final family of embodiments of the present invention, a systematic linear block code with particular characteristics, discussed below, is referred to as $\tilde{C}_{m \times n}$. FIG. 12 illustrates the particular characteristics of the code $\tilde{C}_{m \times n}$ needed for the family of embodiments of the present invention discussed with reference to FIGS. 12-17. Many different codes may exist for any particular integers m and n. FIG. 12 shows representations of the array codewords contained in an exemplary $\tilde{C}_{m \times n}$. Each suitable code $\tilde{C}_{m \times n}$ includes all array codewords 1202 that each contains only "0" entries, except for one all "1" column. Additionally, each suitable $\tilde{C}_{m \times n}$ code also contains all array codewords 1204, each of which contains all "0" entries, except for one all "1" row. A suitable $\tilde{C}_{m \times n}$ code additionally contains array codewords that represent all possible linear combinations of array codewords selected from the two sets of codewords 1202 and 1204. For example, array codeword 1210 is the linear combination of array codewords 1212 and 1214. The code $\tilde{C}_{m \times n}$ may additionally contain other codewords. Because the code $\tilde{C}_{m \times n}$ contains the two sets of codewords 1202 and 1204, the code is essentially closed with respect to row inversion and column inversion. In other words, if an array A is a codeword in the code $\tilde{C}_{m \times n}$, then inverting any column or row of the array A produces an array A' which is also a codeword of code $\tilde{C}_{m \times n}$.

Figure 13:
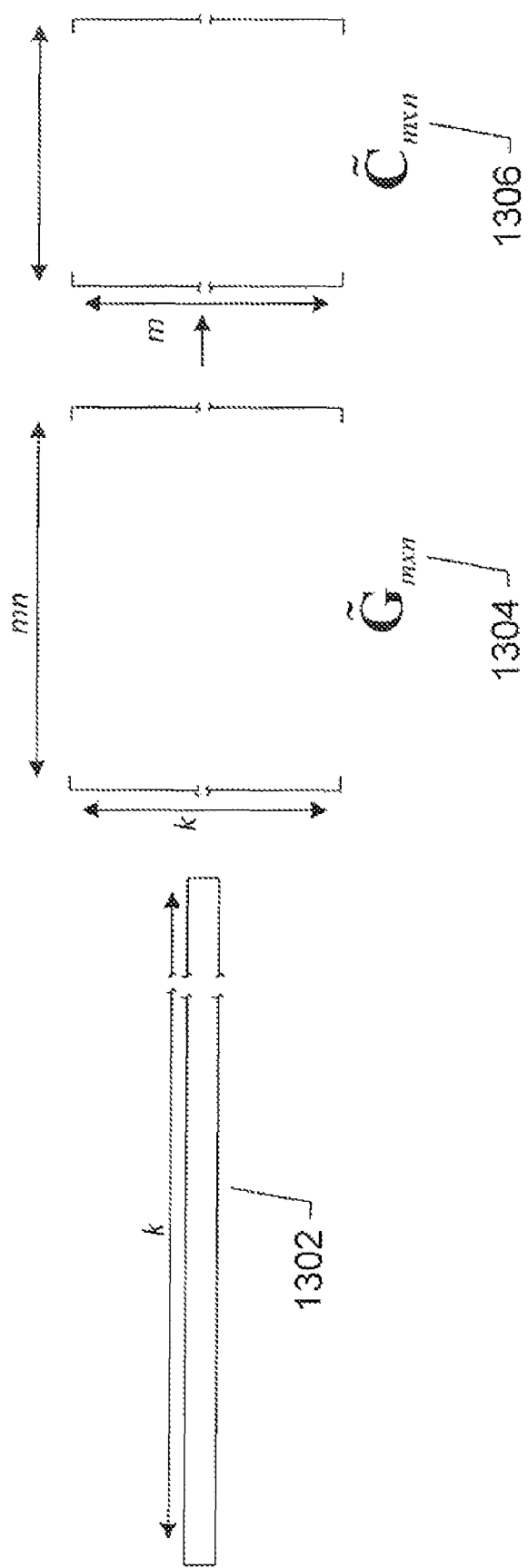

FIG. 13 shows the components of the linear block code used in the final family embodiments of the present invention. A vector of k bits 1302 is multiplied by the generator matrix for $\tilde{C}_{m \times n}$, $\tilde{G}_{m \times n}$ 1304, to produce an m×n array codeword of the code 1306.

Figure 14:
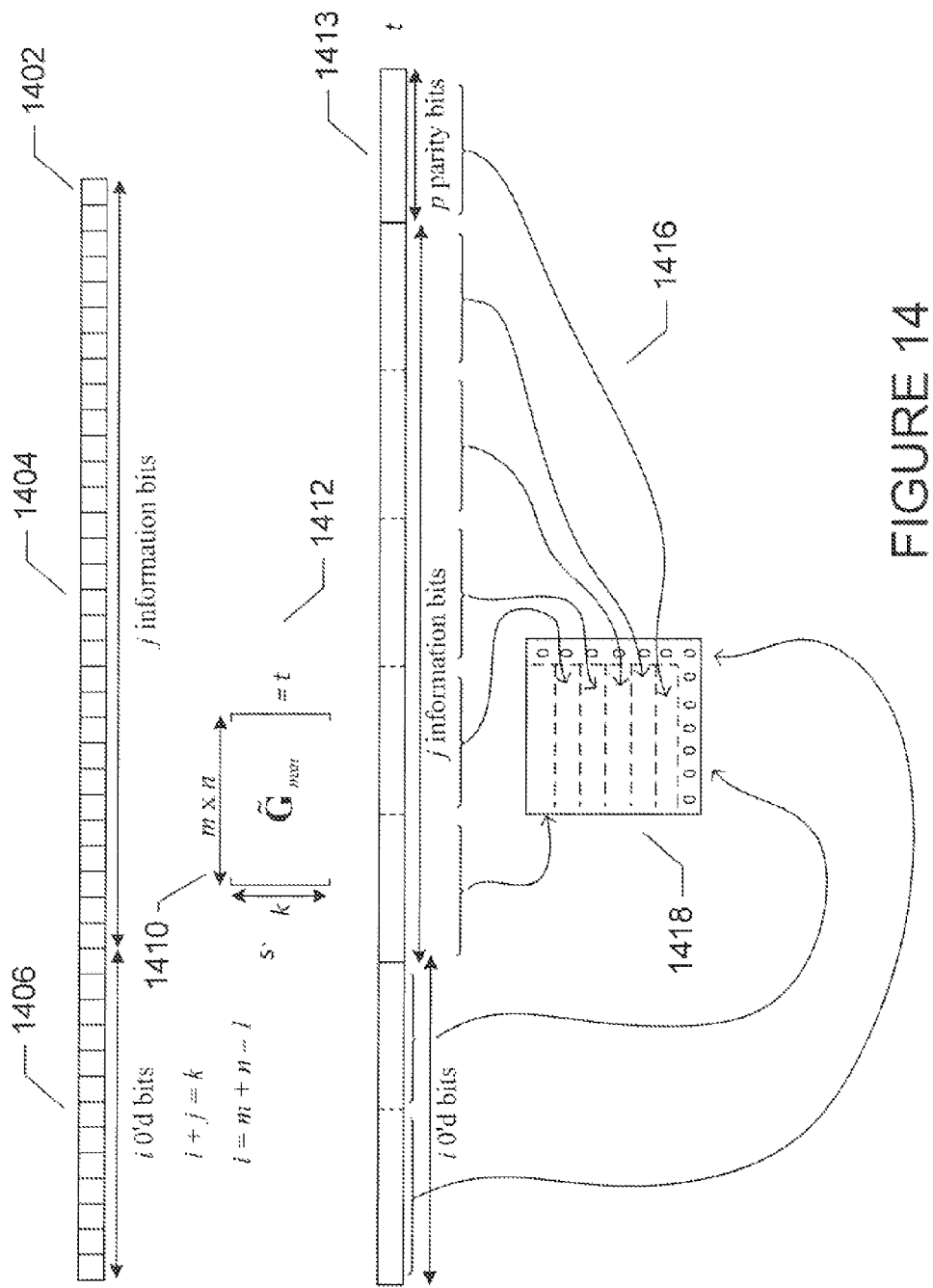

FIG. 14 illustrates the encoding method of the final family of embodiments of the present invention. A vector s 1402 is constructed to contain j information bits 1404 and i bits with value "0" 1406. The following relationships hold:

$$i+j=k$$

$$i=m+n-1$$

Figure 15:
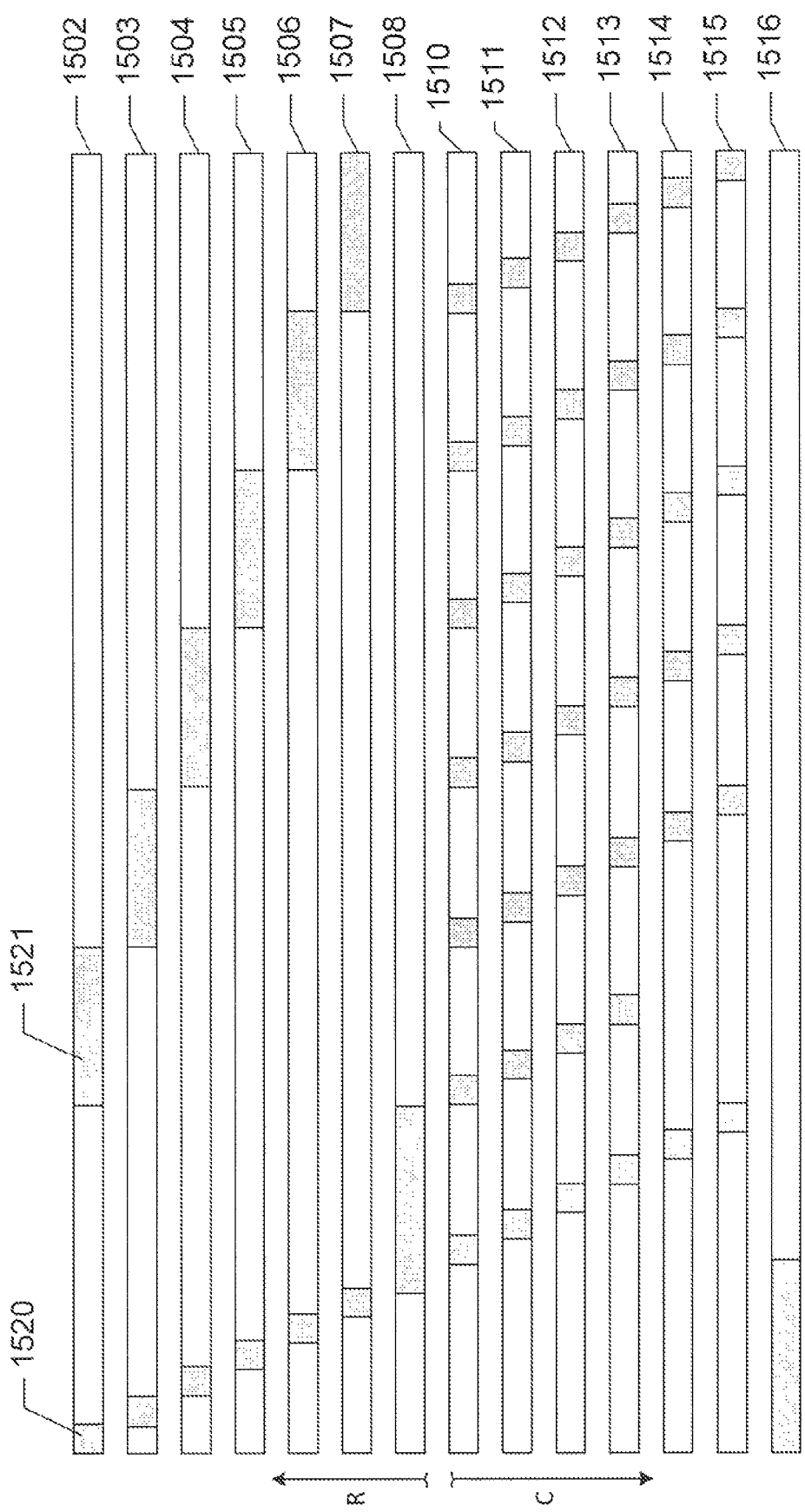

The vector s is multiplied by $\tilde{G}_{m \times n}$ 1410 to produce a vector t 1412, which is a codeword of $\tilde{C}_{m \times n}$. The codeword vector t includes an additional number p of parity bits 1413. An array codeword corresponding to the codeword vector t can then be constructed 1416 by placing the i zero bits into the final column and row of the array codeword 1418, and adding the j information bits and p parity bits as complete rows to fill the array codeword. The array codeword can then be subject to the column-and-row inversion method, represented by the while-loop of steps 606-608 in FIG. 6A, so that the array codeword satisfies the Hamming-weight constraint. In the example shown in FIGS. 12-14, ensuring that a code has the appropriate properties to be a $\tilde{C}_{m \times n}$ code requires that the code contain the all "1" row and all "1" column codewords in the family of codewords 1202 and 1204 discussed with reference to FIG. 12. Because of the mapping between codeword vector t 1412 in FIG. 14 and the final array codeword 1418 in FIG. 14, the requirement that the code contain the all "1" row and all "1" column codewords is somewhat different with respect to vector t. FIG. 15 illustrates a translation of the all "1" column and row codeword requirement, discussed above with reference to FIG. 12, to an analogous requirement for the vector codewords represented by vector t in FIG. 14. In FIG. 15, each bar, such as bar 1502, represents a vector codeword of the code $\tilde{C}_{m \times n}$. The first seven codewords 1502-1510 correspond to the all "1"-row codewords in the set of codewords 1204 in FIG. 12, and the second seven codewords 1510-1516 correspond to the all "1" column codewords in the set of codewords 1202 in FIG. 12. The darkened portion of the codewords, such as darkened portion 1520 and 1521 of codeword 1502 represent the regions of the codewords corresponding to a row, in the case of codeword 1502, or column, in the case of codewords 1510-1516, in the array codeword formed from the vector codeword in the process discussed with reference to FIG. 14. Thus, $\tilde{C}_{m \times n}$ must contain the vector codewords with bit values "1" in the darkened portions of the vector codewords shown in FIG. 15. Darkened portion 1520 of codeword 1502 corresponds to a single bit. There are methods, beyond the scope of the present invention, for constructing generator matrices $\tilde{G}_{m \times n}$ for codes $\tilde{C}_{m \times n}$ with the properties discussed above with reference to FIGS. 12 and 15. Alternatively, such codes can be identified by computational search of the codewords produced by different generator matrices.

Figure 16:
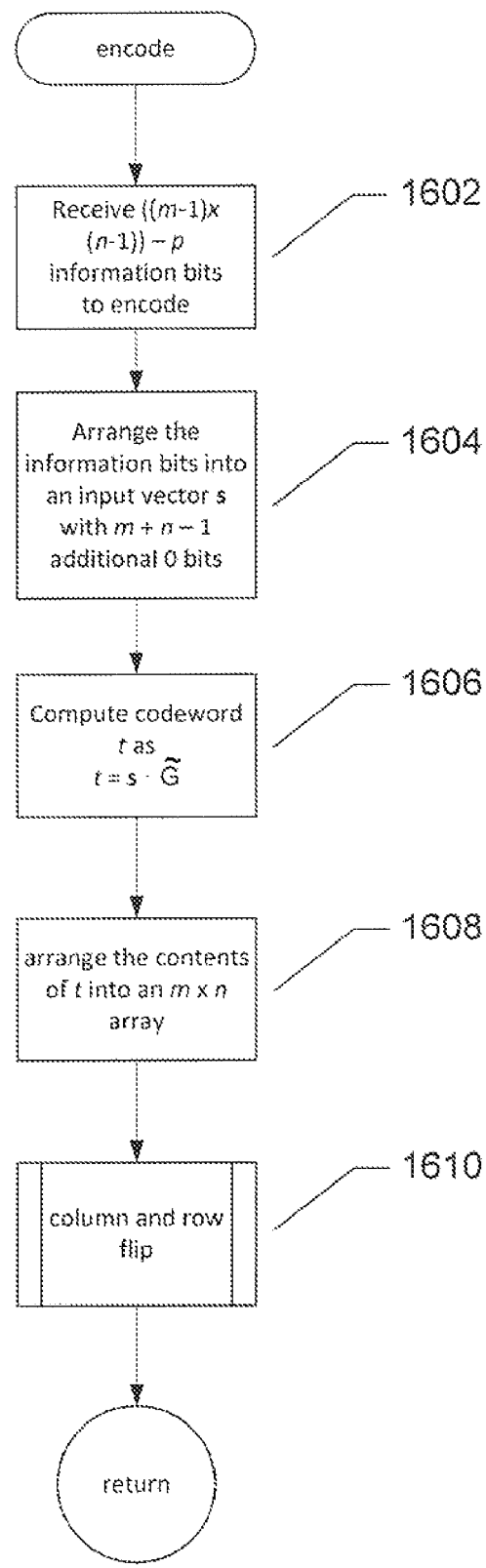
Figure 17:
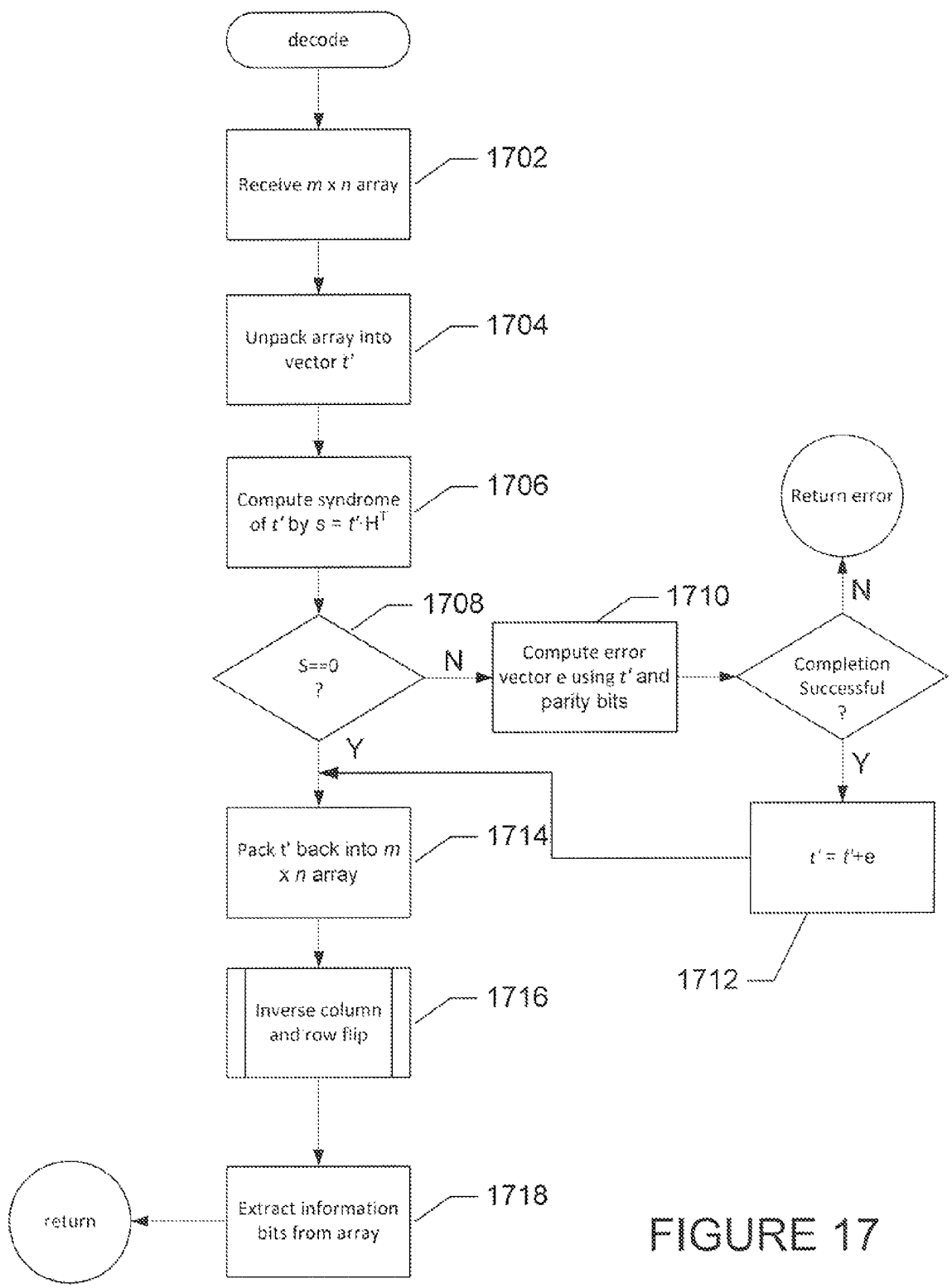

FIGS. 16 and 17 provide control-flow diagrams for the encoding and decoding methods of the family of embodiments of the present invention discussed with reference to FIGS. 12-17. Encoding is carried out by receiving the information bits, in step 1602, arranging the information bits into the vector s 1604 (1402 in FIG. 14), computing the codeword t by multiplying the vector s by the generator matrix $\tilde{G}_{m \times n}$ in step 1606, arranging the bits of t into an m×n array codeword in step 1608, and then carrying out the row-and-column inversion method, in step 1610, shown as steps 606-608 in FIG. 6A. The corresponding decoding process begins with receiving an m×n array in step 1702 of FIG. 17. The array is unpacked into a vector t' in step 1704. A syndrome for the vector is computed by multiplying t' by the transpose of the parity-check matrix, in step 1706. When the syndrome is not the all-0 vector, as determined in step 1708, an estimate of the error vector ê is computed, in step 1710, and used, when possible, to correct errors in the codeword t', in step 1712. The vector t' is then rearranged into the m×n array, in step 1714, as discussed above with reference to FIG. 14, and the m×n array is subject to the inverse of the column-and-row inversion operation, represented by the nested for-loops shown in steps 668-673 in FIG. 68, in step 1716. The information bits are extracted from this array, in step 1718, and returned as the decoded information.

Figure 18:
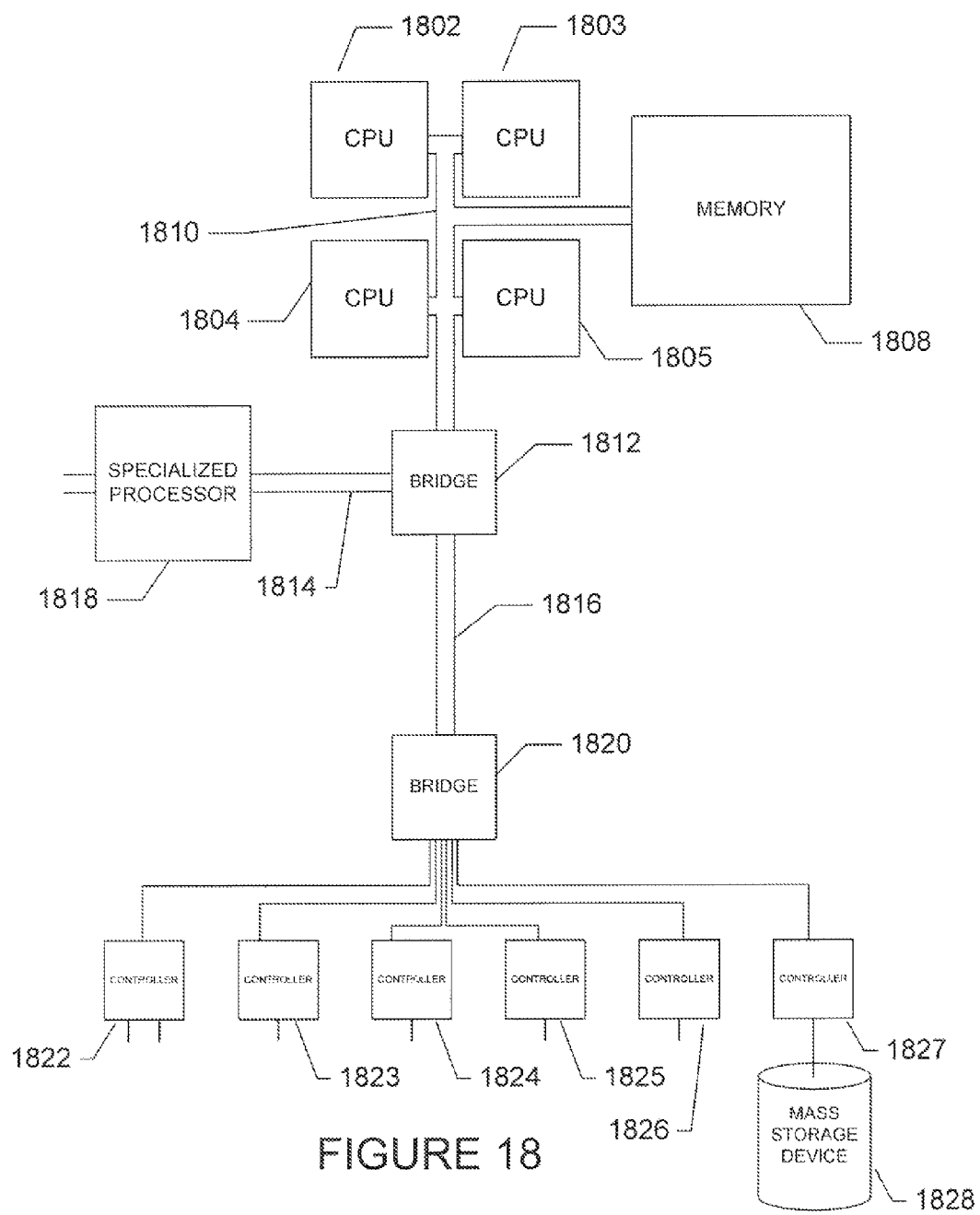
FIG. 18 illustrates a general-purpose computer system that, when executing an implemented method embodiment of the present invention, comprises a system embodiment of the present invention.

FIG. 18 illustrates a general-purpose computer system that, when executing an implemented method embodiment of the present invention, comprises a system embodiment of the present invention. The computer system contains one or multiple central processing units ("CPUs") 1802-1805, one or more electronic memories 1808 interconnected with the CPUs by a CPU/memory-subsystem bus 1810 or multiple busses, a first bridge 1812 that interconnects the CPU/memory-subsystem bus 1810 with additional busses 1814 and 1816, or other types of high-speed interconnection media, including multiple, high-speed serial interconnects. These busses or serial interconnections, in turn, connect the CPUs and memory with specialized processors, such as a graphics processor 1818, and with one or more additional bridges 1820, which are interconnected with high-speed serial links or with multiple controllers 1822-1827, such as controller 1827, that provide access to various different types of mass-storage devices 1828, electronic displays, input devices, and other such components, subcomponents, and computational resources. Embodiments of the present invention may also be implemented on distributed computer systems and can also be implemented partially in hardware logic circuitry.

Although the present invention has been described in terms of particular embodiments, it is not intended that the invention be limited to these embodiments. Modifications will be apparent to those skilled in the art. For example, a variety of different implementations of the various embodiments of the present invention can be obtained by varying any of many different implementation parameters, including programming language, modular organization, control structures, data structures, and other such implementation parameters. Many embodiments of the represent invention employ systematic coding and decoding techniques, including systematic linear block codes. A variety of different systematic coding and decoding techniques can be used in certain embodiments of the present invention. While descriptions of embodiments of the present invention refer to vectors, array codewords, and other such entities, these entities may be implemented in various ways for storage and retrieval from computer memory and mass-storage devices, and often, a vector codeword and an array codeword equivalent to the vector codeword may be stored in one form that is programmatically transformed to between various formal representations. Thus, for example, were a two-dimensional data array used to store a codeword, the two-dimensional data array can be programmatically treated as a vector codeword for matrix multiplication by a generator matrix. While the above discussion of embodiments of the present invention use vectors and arrays containing elements of the GF(2) field, equivalent methods can be implemented to handle information encoded using elements of other fields. The positions of the all-0 column and row of the array codewords is illustrated and described as the final row and column of the array codeword, but other positions can be selected for the all-0 row and column, in alternative embodiments of the present invention. Of course, an opposite convention, in which the reserved row and column are initialized to have bits with "1" values, and the inverse of the column-and-row inversion inverts bits when the sum of related bits is even, can also be used to implement embodiments of the present invention. Similarly, in the vector-encoding embodiments of the present invention, the additional bit can be initially set to "0," with inversion indicated by a value "1" in the additional bit. In similar fashion, the weight of a codeword can be computed according to either of two conventions, the convention chosen determining the nature of the threshold comparison used to decide whether or not to invert a row, column, or vector codeword.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method, encoded in computer instructions and executed by a computer system, that encodes k information bits and writes the encoded k information bits to an electronic memory, method comprising:
    systematically encoding the k information bits with an error correction code to produce a codeword with error-correction parity bits, wherein the error-correction parity bits are to enable the codeword to recover from bit-transition errors that may occur during storage of the codeword in, and retrieval of the codeword from, the electronic memory;
    ensuring that the codeword does not violate a weight constraint, including:
        determining a weight of a subset of the codeword;
        if the weight of the subset of the codeword exceeds a threshold value t, applying a bitwise complement operation to the subset of the codeword by inverting values of bits in the subset of the codeword; and
    writing the codeword to the electronic memory.

2. The method of claim 1,
    wherein the k information bits are systematically encoded by a generator matrix; and
    wherein the distance, in weight, between two codewords generated by systematically encoding two vectors of k information bits is related to the distance, in weight, between the two vectors.

3. The method of claim 2, wherein a vector corresponding to a codeword stored in the electronic memory is retrieved from the electronic memory and decoded by:
    reading the vector from the electronic memory; and
    decoding the codeword to recover the k information bits.

4. The method of claim 1, wherein systematically encoding the k information bits includes:
    adding an additional bit with a first value to the k information bits to form a vector of length k+1; and
    systematically encoding the vector with the error correction code to produce a codeword with the error-correction parity bits, wherein the systematic encoding is further to produce codewords of a code that contains the bitwise complement of each codeword.

5. The method of claim 4, wherein a vector corresponding to the codeword stored in the electronic memory is retrieved from the electronic memory and decoded by:
    decoding the vector to detect and correct errors in the vector;
    determining the value of the added additional bit;
    when the added additional bit has a second value, inverting the vector by the bitwise-complement operation;
    extracting the k information bits from the vector; and
    storing the k information bits in an electronic memory or transmitting the k information bits through a communications medium.

6. The method of claim 1, wherein systematically encoding the k information bits and ensuring that the codeword does not violate a weight constraint include:
    arranging the k information bits into positions of an m×n array codeword except for positions in one designated row and one designated column of the array codeword;
    initializing the positions in the designated row and column to a first value;
    reserving p positions in the array codeword for p error-correction parity bits, the designated row and column representing m+n−1 additional bits with a first value added to the information bits;
    determining a weight of each row and column in the array codeword;
    if the weight of one of the rows or columns in the array codeword is greater than the threshold value t, inverting values of all non-reserved non-parity-bit positions in that row or column by the bitwise-complement operation;
    systematically encoding the non-reserved non-parity-bit positions of array codeword to compute the p error-correction parity bits; and
    inserting the p error-correction parity bits in the p reserved positions.

7. The method of claim 6, wherein an array codeword corresponding to the codeword stored in the electronic memory is retrieved from the electronic memory and decoded by:
    systematically decoding the array codeword to detect and correct errors in the array codeword;
    for each row other than the designated row and for each column other than the designated column, when a sum of the designated-row bit in the column, the designated-column bit in the row, and the bit at the intersection of the designated column and designated row has a first value, inverting a non-reserved bit at the intersection of the row and column;
    extracting the k information bits; and
    storing the k information bits in an electronic memory or transmitting the k information bits through a communications medium.

8. The method of claim 1, wherein systematically encoding the k information bits includes:
    adding m+n−1 additional bits, having a first value, to the k information bits; and systematically encoding the k information bits and the m+n−1 additional bits with an error correction code to generate a codeword $\tilde{C}_{m \times n}$ of a code that includes m×n array codewords, wherein each of the array codewords has a row or column with bits having a value opposite from the first value, wherein the code contains all possible linear combinations of the array codewords, and wherein the m+n−1 additional bits are placed in a designated row and column of each of the array codewords.

9. The method of claim 8, wherein an array codeword corresponding to a codeword stored in the electronic memory is retrieved from the electronic memory and decoded by:

systematically decoding the array codeword to detect and correct errors in the array codeword;

for each row other than the designated row and for each column other than the designated column, when a sum of the designated-row bit in the column, the designated-column bit in the row, and the bit at the intersection of the designated column and designated row has a first value, inverting a bit at the intersection of the row and column;

extracting the k information bits and storing the k information bits in an electronic memory or transmitting the k information bits through a communications medium.

10. A system that encodes information bits for storage in an electronic memory, the system comprising:

one or more processors within a computer system; and a memory on which is embedded a set of computer instructions that, when executed by the one or more processors, are to:

systematically encode the k information bits with an error correction code to produce a codeword with error-correction parity bits, wherein the error-correction parity bits are to enable the codeword to recover from bit-transition errors that may occur during storage of the codeword in, and retrieval of the codeword from, the electronic memory;

ensure that the codeword does not violate a weight constraint, including:

determine a weight of a subset of the codeword;

if the weight of the subset of the codeword exceeds a threshold value t, apply a bitwise complement operation to the subset of the codeword by inverting values of bits in the subset of the codeword; and write the codeword to the electronic memory.

11. The system of claim 10, wherein the system systematically encodes the k information bits using a generator matrix; and wherein the distance, in weight, between two codewords generated by systematically encoding two vectors of k information bits is related to the distance, in weight, between the two vectors.

12. The system of claim 11, wherein the set of computer instructions are further to:

read a vector corresponding to the codeword from the electronic memory; and decode the codeword to recover the k information bits.

13. The system of claim 10, wherein, to systematically encode the k information bits, the set of computer instructions are to:

add an additional bit with a first value to the k information bits to form a vector of length k+1, systematically encode the vector with the error correction code to produce a codeword with the error-correction parity bits, wherein the systematic encoding is further to produce codewords of a code that contains the bitwise complement of each codeword.

14. The system of claim 13, wherein the set of computer instructions are further to:

retrieve a vector corresponding to the codeword stored in the electronic memory;

decode the vector to detect and correct errors in the vector;

determine the value of the added additional bit;

when the added additional bit has a second value, inverting the vector by the bitwise-complement operation;

extract the k information bits from the vector; and store the k information bits in an electronic memory or transmit the k information bits through a communications medium.

15. The system of claim 11, wherein, to systematically encode the k information bits and ensure that the codeword does not violate a weight constraint, the set of computer instructions are to:

arrange the k information bits into positions of an m×n array codeword except for positions in one designated row and one designated column of the array codeword;

initialize the positions of the designated row and column to a first value;

reserve p positions in the array codeword for p error-correction parity bits, the designated row and column representing m+n−1 additional bits with a first value added to the information bits;

determine a weight of each row and column in the array codeword;

if the weight of one of the rows or columns in the array codeword is greater than the threshold value t, invert values of all non-reserved non-parity-bit positions in that row or column by the bitwise-complement operation;

systematically encode the non-reserved non-parity-bit positions of array codeword to compute the p error-correction parity bits; and insert the p error-correction parity bits in the p reserved positions.

16. The system of claim 15, wherein the set of computer instructions are further to:

retrieve an array codeword corresponding to the codeword stored in the electronic memory;

systematically decode the array codeword to detect and correct errors in the array codeword;

for each row other than the designated row and for each column other than the designated column, when a sum of the designated-row bit in the column, the designated-column bit in the row, and the bit at the intersection of the designated column and designated row has a first value, invert a non-reserved bit at the intersection of the row and column;

extract the k information bits; and store the k information bits in an electronic memory or transmit the k information bits through a communications medium.

17. The system of claim 10, wherein, to systematically encode the k information bits, the set of computer instructions are to:

add m+n−1 additional bits, having a first value, to the k information bits; and systematically encode the k information bits and the m+n−1 additional bits with an error correction code to generate a codeword $\tilde{C}_{m \times n}$ of a code that includes m×n array codewords, wherein each of the array codewords has a row or column with bits having a value opposite from the first value, wherein the code contains all possible linear combinations of the array codewords, and wherein the m+n−1 additional bits are placed in a designated row and column of each of the array codewords.

18. The system of claim 17, the set of computer instructions are further to:
retrieve an array codeword corresponding to a codeword stored in the electronic memory;
systematically decode the array codeword to detect and correct errors in the array codeword;
for each row other than the designated row and for each column other than the designated column, when a sum of the designated-row bit in the column, the designated-column bit in the row, and the bit at the intersection of the designated column and designated row has a first value, invert a bit at the intersection of the row and column;
extract the k information bits; and
store the k information bits in an electronic memory or transmit the k information bits through a communications medium.

19. An electronic memory comprising:
memory elements, each storing a binary value "0" or "1;"
logic to receive an input word having k information bits, store the input word as a codeword having the k information bits, along with r additional bits, each bit of the r additional bits indicating whether a subset of the k information bits have been inverted by a bitwise complement operation, and p error-correction parity bits, into k+p+r memory elements,
wherein the logic is to ensure that the codeword does not violate a weight constraint by determining a weight of a subset of the codeword, and if the weight of the subset of the codeword exceeds a threshold value t, applying a bitwise complement operation to the subset of the codeword by inverting values of bits in the subset of the codeword; and
logic to retrieve k information bits, r additional bits, and p error-correction parity bits from k+p+r memory elements, and use each of the r additional bits to determine whether to invert, by the bitwise complement operation, a different subset of the k information bits.

20. The electronic memory of claim 19 wherein the k information bits form an m×n array of information bits and r equals m+n−1.

* * * * *

UNITED STATES PATENT AND TRADEMARK OFFICE
CERTIFICATE OF CORRECTION

PATENT NO. : 8,407,560 B2
APPLICATION NO. : 12/836405
DATED : March 26, 2013
INVENTOR(S) : Erik Ordentlich et al.

Page 1 of 1

It is certified that error appears in the above-identified patent and that said Letters Patent is hereby corrected as shown below:

In the Claims

In column 19, line 23, in Claim 9, delete "bits" and insert -- bits; --, therefor.

Signed and Sealed this
Seventeenth Day of September, 2013

Teresa Stanek Rea
*Deputy Director of the United States Patent and Trademark Office*